United States Patent
Jeon

(10) Patent No.: US 11,048,584 B2
(45) Date of Patent: Jun. 29, 2021

(54) CONTROLLER AND METHOD OF OPERATING THE SAME

(71) Applicant: SK hynix Inc., Gyeonggi-do (KR)

(72) Inventor: Seong Bae Jeon, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 96 days.

(21) Appl. No.: 16/381,210

(22) Filed: Apr. 11, 2019

(65) Prior Publication Data

US 2020/0081775 A1 Mar. 12, 2020

(30) Foreign Application Priority Data

Sep. 6, 2018 (KR) ................. 10-2018-0106736

(51) Int. Cl.
*G06F 11/00* (2006.01)
*G06F 11/10* (2006.01)
*G11C 29/52* (2006.01)
*G06F 3/06* (2006.01)

(52) U.S. Cl.
CPC .......... *G06F 11/1068* (2013.01); *G06F 3/064* (2013.01); *G06F 3/0619* (2013.01); *G06F 3/0679* (2013.01); *G11C 29/52* (2013.01)

(58) Field of Classification Search
CPC .... G06F 11/1068; G06F 3/0679; G06F 3/064; G06F 3/0619; G06F 11/1048; G06F 11/1004; G11C 29/52; G11C 2029/0411
USPC ................. 714/755, 758, 763, 764
See application file for complete search history.

(56) References Cited

U.S. PATENT DOCUMENTS

| 6,480,416 B2* | 11/2002 | Katayama | G06F 11/1008 365/185.09 |
| 2014/0043903 A1* | 2/2014 | Ok | G11C 29/028 365/185.03 |
| 2015/0178154 A1* | 6/2015 | Kim | H03M 13/2927 714/758 |
| 2016/0062830 A1* | 3/2016 | Cha | G11C 29/702 714/764 |
| 2016/0072529 A1* | 3/2016 | Suzuki | H03M 13/293 714/755 |
| 2016/0378595 A1* | 12/2016 | Rho | H03M 13/152 714/764 |
| 2017/0102996 A1* | 4/2017 | Yu | G06F 3/0619 |
| 2017/0168892 A1* | 6/2017 | Roh | G06F 3/0679 |
| 2017/0269996 A1* | 9/2017 | Shono | G11C 29/52 |
| 2018/0198470 A1* | 7/2018 | Lee | H03M 13/2927 |

(Continued)

FOREIGN PATENT DOCUMENTS

| KR | 10-2017-0052066 | 5/2017 |
| KR | 10-2018-0005584 | 1/2018 |

*Primary Examiner* — Albert Decady
*Assistant Examiner* — Osman M Alshack
(74) *Attorney, Agent, or Firm* — IP & T Group LLP

(57) ABSTRACT

A controller for controlling an operation of a semiconductor memory device includes an error correction block and a block manager. The error correction block may perform an error correction operation on read data received from the semiconductor memory device. The block manager may analyze a result of the error correction operation and selectively perform defect processing on a target memory block in which the read data is stored, based on a number of error correction units in which an error correction failure has occurred, among a plurality of error correction units included in the read data.

15 Claims, 25 Drawing Sheets

(56) References Cited

U.S. PATENT DOCUMENTS

2018/0217894 A1* 8/2018 Park .................... G11C 11/4078
2019/0140666 A1* 5/2019 Lee ................... H03M 13/2906

* cited by examiner

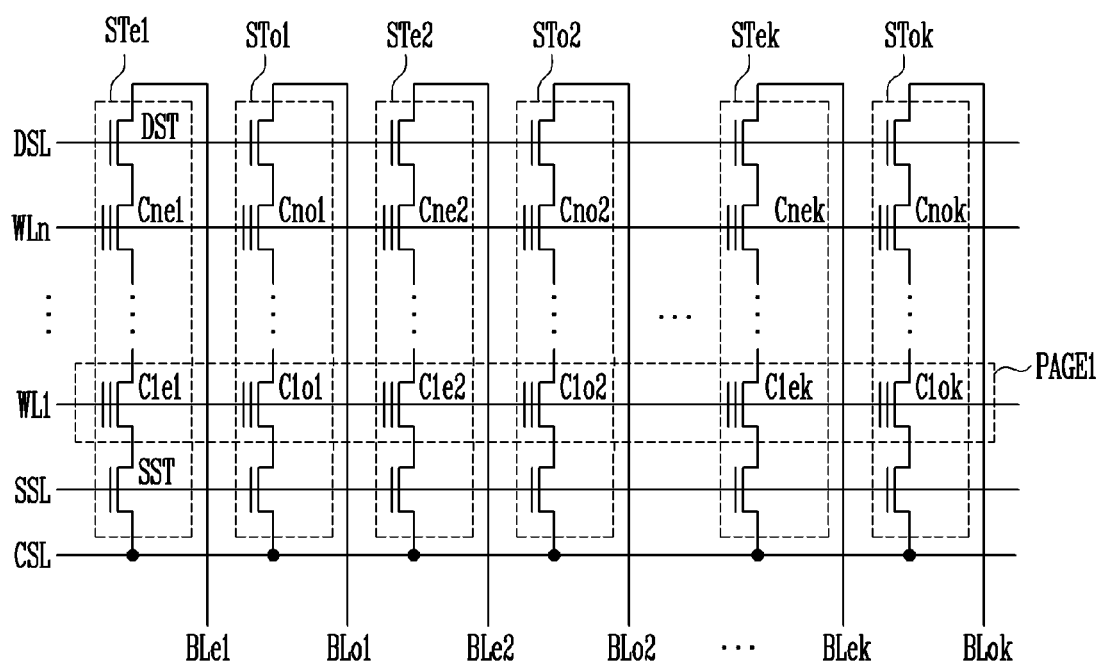

CONTROLLER AND METHOD OF OPERATING THE SAME

CROSS-REFERENCE TO RELATED APPLICATION

The present application claims priority under 35 U.S.C. § 119(a) to Korean patent application number 10-2018-0106736, filed on Sep. 6, 2018, the entire disclosure of which is incorporated herein by reference in its entirety.

BACKGROUND

1. Field of Invention

Various embodiments of the present disclosure generally relate to an electronic device, and more particularly, to a controller and a method of operating the controller.

2. Description of Related Art

A memory device may have a two-dimensional (2D) structure in which strings are horizontally arranged on a semiconductor substrate. Alternatively, the memory device may have a three-dimensional (3D) structure in which strings are vertically stacked on a semiconductor substrate. As the 2D structure is reaching its physical scaling limit, semiconductor manufacturers are producing memory devices having the 3D structure that include a plurality of memory cells vertically stacked on a semiconductor substrate. A controller controls the operation of the memory device having the 2D or 3D structure.

SUMMARY

Various embodiments of the present disclosure are directed to a controller, which may efficiently use memory blocks of a semiconductor memory device.

Various embodiments of the present disclosure are directed to a method of operating a controller, which may efficiently use memory blocks of a semiconductor memory device.

An embodiment of the present disclosure may provide for a controller for controlling an operation of a semiconductor memory device. The controller may include an error correction block and a block manager. The error correction block may be configured to perform an error correction operation on read data received from the semiconductor memory device. The block manager may be configured to analyze a result of the error correction operation and selectively perform defect processing on a target memory block in which the read data is stored, based on a number of error correction units in which an error correction failure has occurred, among a plurality of error correction units included in the read data.

In an embodiment, the block manager may perform the defect processing on the target memory block when the error correction failure has occurred in two or more of the plurality of error correction units.

In an embodiment, the block manager is configured not to perform the defect processing on the target memory block when the error correction failure has occurred in one of the plurality of error correction units.

In an embodiment, the block manager is configured to perform a recovery operation on the read data and perform a read reclaim operation using the read data when the error correction failure has occurred in one of the plurality of error correction units.

In an embodiment, the block manager may include an error correction result analyzer, a data backup processor, a bad block register, and a bad block information storage. The error correction result analyzer may be configured to analyze the result of the error correction operation and generate first detection data indicating that the error correction failure has occurred in one error correction unit or second detection data indicating that the error correction failure has occurred in two or more error correction units. The data backup processor may be configured to generate a backup control signal for data backup processing related to the read data in response to any one of the first detection data and the second detection data. The bad block register may be configured to generate bad block information about the target memory block in response to the second detection data. The bad block information storage may be configured to store the bad block information.

In an embodiment, the controller may further include a command generator configured to generate a command for controlling an operation of the semiconductor memory device. The command generator may generate a command for a data backup operation related to the read data in response to the backup control signal.

In an embodiment, the block manager may further include a block test performance component. The block test performance component may be configured to generate a block test control signal for a block test operation on the target memory block in response to the first detection data.

In an embodiment, the command generator may generate a command for testing the target memory block in response to the block test control signal.

In an embodiment, the controller may further include a buffer memory configured to store the read data.

In an embodiment, the block manager may further include a weak block information storage and a block test performance component. The weak block information storage may be configured to register the target memory block as a weak block in response to the first detection data. The block test performance component may be configured to generate a block test control signal for performing a test operation on the weak block based on weak block information provided from the weak block information storage.

In an embodiment, the weak block information storage may transfer the weak block information to the block test performance component during idle time of the semiconductor memory device.

An embodiment of the present disclosure may provide for a method of operating a controller for controlling a semiconductor memory device. The method may include receiving read data from the semiconductor memory device, performing an error correction operation on the read data, and analyzing a result of the error correction operation and selectively performing defect processing on a target memory block in which the read data is stored, based on a number of error correction units in which an error correction failure has occurred, among a plurality of error correction units included in the read data.

In an embodiment, analyzing the result of the error correction operation and selectively performing defect processing on the target memory block may include determining whether error correction in each of the plurality of error correction units included in the read data has succeeded, and when it is determined that the error correction failure has occurred, determining whether the error correction failure has occurred in two or more error correction units.

In an embodiment, analyzing the result of the error correction operation and selectively performing defect processing on the target memory block may further include performing defect processing on the target memory block when it is determined that the error correction failure has occurred in two or more error correction units.

In an embodiment, selectively performing defect processing on the target memory block may include performing a recovery operation on the read data, storing data of the target memory block in an additional memory block using the recovered read data, updating a mapping table associated with the target memory block, and registering the target memory block in a bad block information storage.

In an embodiment, the method may further include, when the error correction failure has occurred in one error correction unit, performing a recovery operation on the read data, and performing a read reclaim operation on the read data.

In an embodiment, the method may further include, when the error correction failure has occurred in one error correction unit, performing a recovery operation on the read data, storing data of the target memory block in an additional memory block, and performing a defect test on the target memory block.

In an embodiment, performing the defect test on the target memory block may include performing an erase operation on the target memory block, programming test data to the target memory block, and reading the programmed data, and then determining whether an error correction failure has occurred in the programmed data.

In an embodiment, the method may further include, when the programmed data is read and the error correction failure has occurred in the programmed data, performing defect processing on the target memory block.

In an embodiment, the method may further include, when the error correction failure has occurred in one error correction unit, performing a recovery operation on the read data, storing data of the target memory block in an additional memory block, and registering the target memory block as a weak block.

An embodiment of the present disclosure may provide a memory system including a semiconductor memory device and a controller. The semiconductor memory device may include a plurality of memory blocks. The controller may be configured to perform an error correction operation on read data received from a target memory block, among the plurality of memory blocks, the read data including a plurality of data chunks; determine a number of data chunks, among the plurality of data chunks, in which an error correction failure has occurred; and when it is determined that the number of data chunks is greater than a threshold value, process the target memory block as a bad block.

BRIEF DESCRIPTION OF THE DRAWINGS

FIG. 9 is a diagram illustrating a relationship between program data and chunks.
FIG. 10 is a circuit diagram illustrating a structure of a memory block of memory blocks BLK1 to BLKz in FIG. 2.

DETAILED DESCRIPTION

Figure 1:
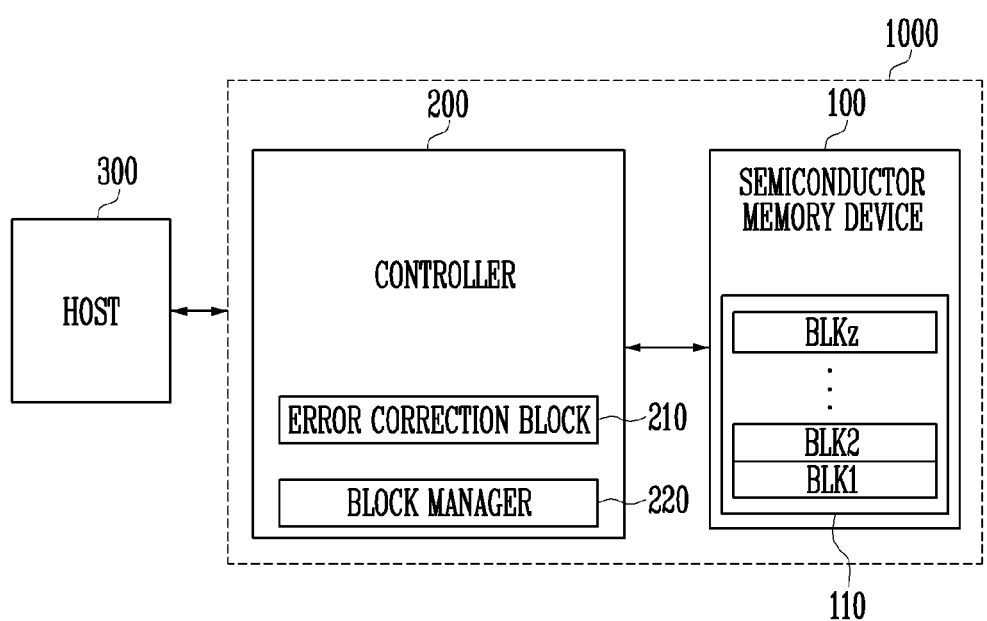
FIG. 1 is a block diagram illustrating a memory system.

Advantages and features of the present disclosure, and methods for achieving the same are presented in the context of embodiments described in detail together with the accompanying drawings. However, elements and features of the present disclosure may be configured or arranged differently than shown and described herein. Accordingly, the present invention is not limited to the following embodiments; rather, the present invention encompasses other embodiments, which may be variations or modifications of the disclosed embodiments. Thus, the present embodiments are provided so that the present disclosure is thorough and complete and fully conveys the technical spirit of the disclosure to those skilled in the art. Also, throughout the specification, reference to "an embodiment," "another embodiment" or the like is not necessarily to only one embodiment, and different references to any such phrase are not necessarily to the same embodiment(s).

It is also noted that in this specification, "connected/coupled" refers to one component not only directly coupling another component but also indirectly coupling another component through one or more intermediate components. In the specification, when an element is referred to as "comprising" or "including" a component, such phrase does not preclude inclusion or addition of one or more other components, unless the context clearly indicates otherwise.

Embodiments in accordance with the present disclosure will be described in detail with reference to the accompanying drawings. The same reference numerals are used throughout the different drawings to designate the same or similar components. Details of well-known configurations and functions may be omitted to avoid unnecessarily obscuring aspects and features of the present disclosure.

FIG. 1 is a block diagram illustrating a memory system 1000.

Referring to FIG. 1, the memory system 1000 includes a semiconductor memory device 100 and a controller 200. Further, the memory system 1000 communicates with a host 300. The semiconductor memory device 100 includes a memory cell array 110, which includes a plurality of memory blocks BLK1, BLK2, . . . , BLKz. The controller 200 controls the overall operation of the semiconductor memory device 100. Further, the controller 200 controls the operation of the semiconductor memory device 100 in response to a command received from the host 300.

The controller 200 may include an error correction block 210 and a block manager 220. The error correction block 210 performs an error correction operation on data received from the semiconductor memory device 100. The block manager 220 may perform defect processing on at least one of the plurality of memory blocks BLK1, BLK2, . . . , BLKz in the memory cell array 110 based on the result of the error correction operation by the error correction block 210.

Figure 2:
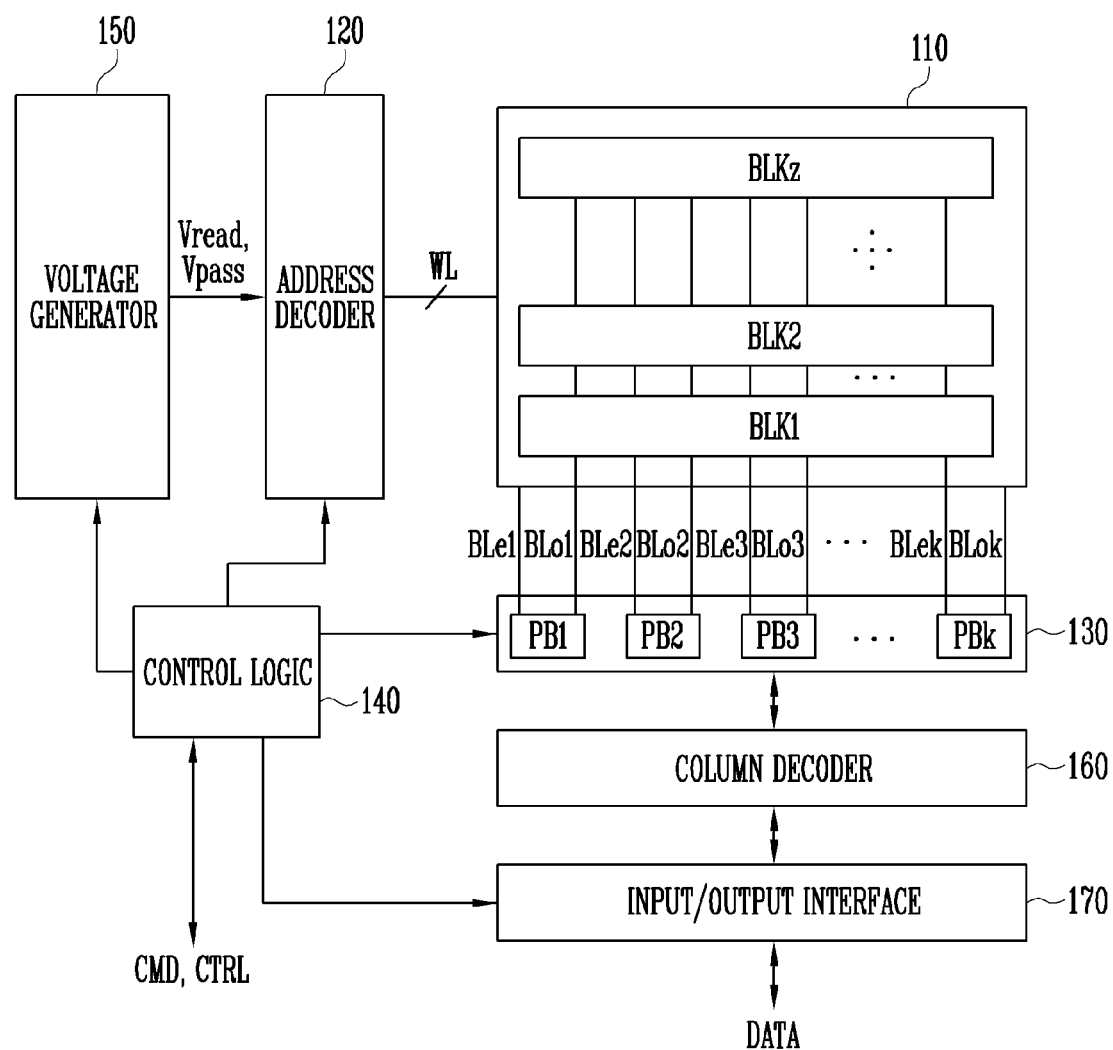
FIG. 2 is a block diagram illustrating the semiconductor memory device of FIG. 1.

FIG. 2 is a block diagram illustrating the semiconductor memory device 100 of FIG. 1.

Referring to FIG. 2, the semiconductor memory device 100 includes a memory cell array 110, an address decoder 120, a read and write circuit 130, control logic 140, a voltage generator 150, a column decoder 160, and an input/output interface 170.

The memory cell array 110 includes a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BLe1 to BLek and BLo1 to BLok. Each of the memory blocks BLK1 to BLKz includes a plurality of memory cells. In an embodiment, the plurality of memory cells may be nonvolatile memory cells, and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Each of the memory cells in the memory cell array 110 may store at least one bit of data. In an embodiment, each of the memory cells in the memory cell array 110 may be a single-level cell (SLC), which stores 1 bit of data. In an embodiment, each of the memory cells in the memory cell array 110 may be a multi-level cell (MLC), which stores 2 bits of data. In an embodiment, each of the memory cells in the memory cell array 110 may be a triple-level cell (TLC), which stores 3 bits of data. In an embodiment, each of the memory cells in the memory cell array 110 may be a quad-level cell (QLC), which stores 4 bits of data. In various embodiments, the memory cell array 110 may include a plurality of memory cells, each of which stores 5 or more bits of data.

The address decoder 120, the read and write circuit 130, the voltage generator 150, the column decoder 160, and the input/output interface 170 are operated as peripheral circuits for operating the memory cell array 110. The address decoder 120 is coupled to the memory cell array 110 through the word lines WL. The address decoder 120 may be operated under the control of the control logic 140. The address decoder 120 receives addresses through an input/output buffer (not illustrated) provided in the semiconductor memory device 100.

The address decoder 120 may decode a block address, among the received addresses. The address decoder 120 selects at least one memory block based on the decoded block address. When a read voltage application operation is performed during a read operation, the address decoder 120 may apply a read voltage Vread, generated by the voltage generator 150, to a selected word line of a selected memory block, and may apply a pass voltage Vpass to the remaining word lines, that is, unselected word lines. During a program verify operation, the address decoder 120 may apply a verify voltage, generated by the voltage generator 150, to a selected word line of a selected memory block, and may apply the pass voltage Vpass to unselected word lines. The address decoder 120 may decode a column address among the received addresses.

The read and program operations of the semiconductor memory device 100 are each performed on a page basis. Addresses received in response to a request for read and program operations may include a block address, a row address, and a column address. The address decoder 120 may select one memory block and one-word line in accordance with the block address and the row address. The address decoder 120 may include a block decoder, a row decoder, and an address buffer.

The read and write circuit 130 includes a plurality of page buffers PB1 to PBk coupled to the memory cell array 110 through bit lines BLe1 to BLek and BLo1 to BLok. In response to a control signal received from the control logic 140, the page buffers PB1 to PBk of the read and write circuit 130 may selectively precharge the bit lines BLe1 to BLek or BLo1 to BLok in accordance with input data so as to store data in the memory cells or may sense the voltages of the bit lines BLe1 to BLek or BLo1 to BLok so as to read data from the memory cells.

During a read operation and a program verify operation, the read and write circuit 130 may sense a change in the amount of current flowing depending on the programmed state of the corresponding memory cell through a sensing node and latch the sensed current change as sensed data while continuously supplying sensing currents to the bit lines coupled to the memory cells so as to sense the threshold voltages of the memory cells.

Data read by the read and write circuit 130 may be output to the controller 200 through the column decoder 160 and the input/output interface 170.

The control logic 140 is coupled to the address decoder 120, the read and write circuit 130, and the voltage generator 150. Further, the control logic 140 may control the operations of the column decoder 160 and the input/output interface 170.

The control logic 140 may receive a command CMD and a control signal CTRL for the semiconductor memory device 100. In FIG. 2, a configuration in which the command CMD and the control signal CTRL are directly transferred to the control logic 140 without passing through the input/output interface 170 is illustrated. However, the configuration of the semiconductor memory device 100 is not limited thereto, and the command CMD and the control signal CTRL may be transferred to the control logic 140 via the input/output interface 170. The control logic 140 may control the overall operation of the semiconductor memory device 100 in response to the control signal CTRL. Also, the control logic 140 may control the read and write circuit 130 so that a read operation and a write operation of the memory cell array 110 are performed.

The voltage generator 150 may generate a read voltage Vread and a pass voltage Vpass required for a read operation in response to the control signal output from the control logic 140. The voltage generator 150 may include a plurality of pumping capacitors for receiving an internal supply voltage to generate a plurality of voltages having various voltage levels, and may generate a plurality of voltages by selectively enabling the plurality of pumping capacitors under the control of the control logic 140.

Figure 3:
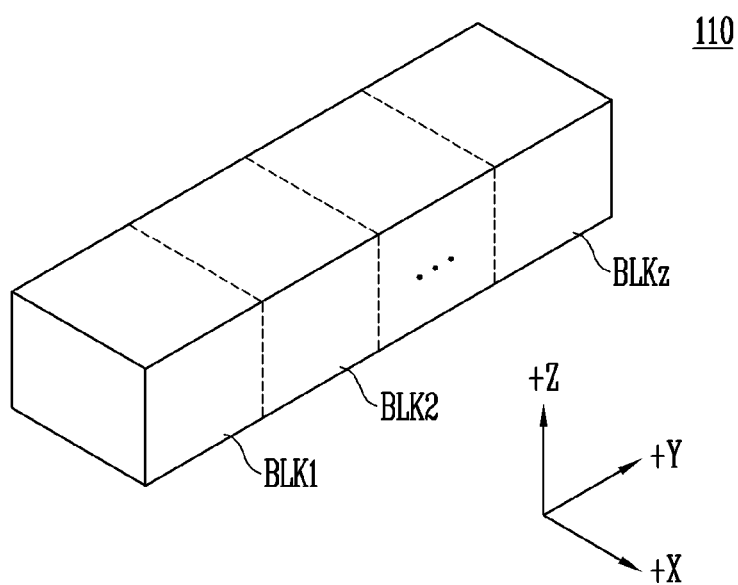
FIG. 3 is a diagram illustrating an example of the memory cell array in FIG. 2.

FIG. 3 is a diagram illustrating an example of the memory cell array 110 of FIG. 2.

Referring to FIG. 3, the memory cell array 110 may include a plurality of memory blocks BLK1 to BLKz. Each memory block may have a three-dimensional (3D) structure. Each memory block includes a plurality of memory cells stacked on a substrate. Such memory cells are arranged along a positive X (+X) direction, a positive Y (+Y) direction, and a positive Z (+Z) direction. The structure of each memory block will be described in detail below with reference to FIGS. 4 and 5.

Figure 4:
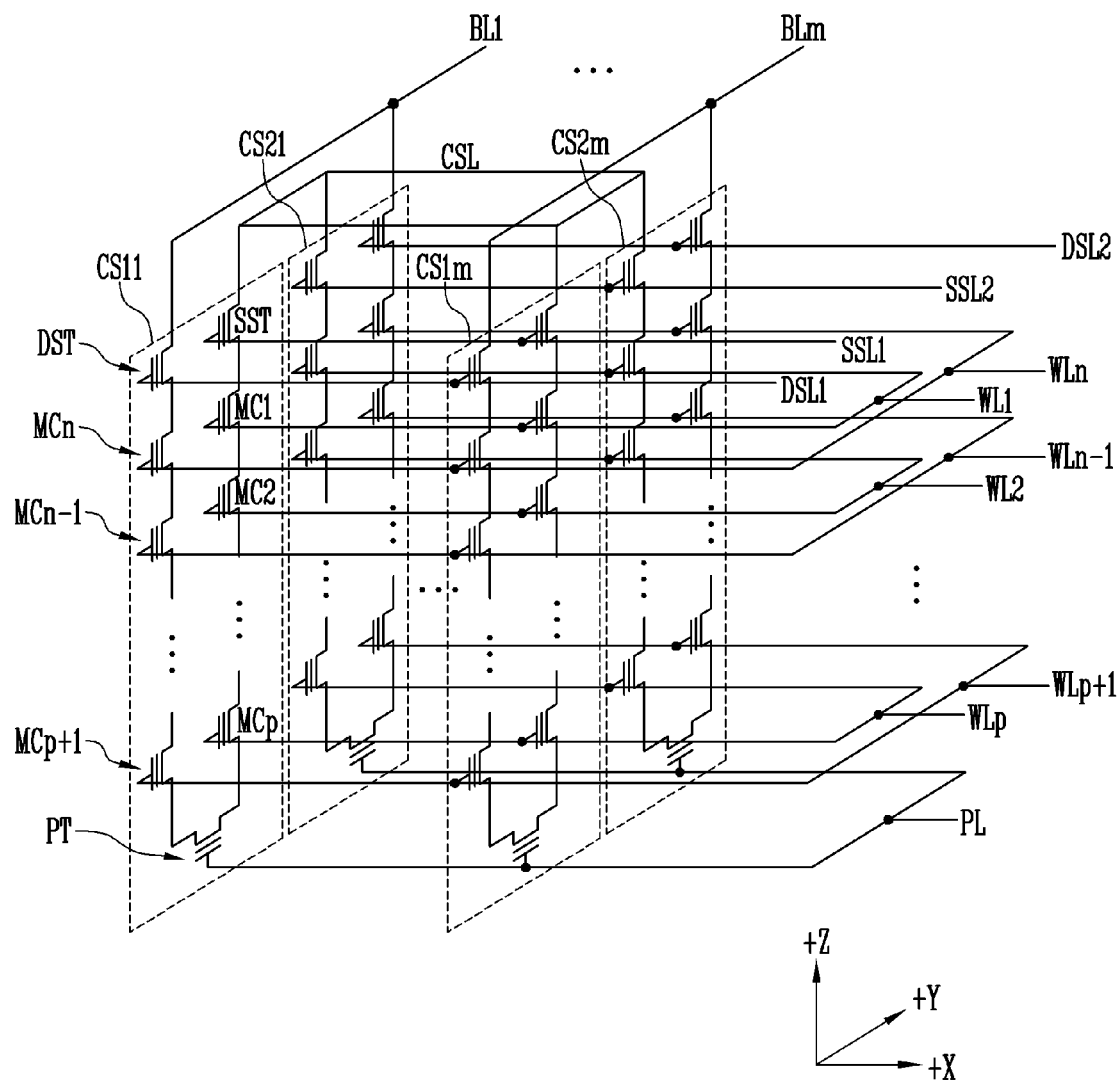
FIG. 4 is a circuit diagram illustrating an exemplary memory block BLKa, which may be any of memory blocks BLK1 to BLKz in FIG. 3.

FIG. 4 is a circuit diagram illustrating an exemplary memory block BLKa, which may be any of the memory blocks BLK1 to BLKz in FIG. 3.

Referring to FIG. 4, the memory block BLKa may include a plurality of cell strings CS11 to CS1*m* and CS21 to CS2*m*. In an embodiment, each of the cell strings CS11 to CS1*m* and CS21 to CS2*m* may be formed in a 'U' shape. In the memory block BLKa, m cell strings are arranged in a row direction (i.e., a positive (+) X direction). In FIG. 4, two cell strings are illustrated as being arranged in a column direction (i.e., a positive (+) Y direction). However, this illustration is made for clarity; it will be understood that three or more cell strings may be arranged in the column direction. Also, it can be seen that the bit lines BL1 to BLm illustrated in FIG. 4 respectively correspond to bit lines BLe1, BLo1, ..., BLek, and BLok illustrated in FIG. 2.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 4, source select transistors of cell strings CS11 to CS1*m* in a first row are coupled to a first source select line SSL1. The source select transistors of cell strings CS21 to CS2*m* in a second row are coupled to a second source select line SSL2.

In an embodiment, source select transistors of the cell strings CS11 to CS1*m* and CS21 to CS2*m* may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a negative (−) Z direction and are connected in series between the source select transistor SST and the pipe transistor PT. The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1*m* in the first row are coupled to a first drain select line DSL1. Drain select transistors of cell strings CS21 to CS2*m* in a second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1*m* and CS2*m* in an m-th column are coupled to an m-th bit line BLm.

The memory cells coupled to the same word line in cell strings arranged in a row direction constitute a single page. For example, memory cells coupled to the first word line WL1, among the cell strings CS11 to CS1*m* in the first row, constitute a single page. Memory cells coupled to the first word line WL1, among the cell strings CS21 to CS2*m* in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even-numbered bit lines and odd-numbered bit lines, instead of first to m-th bit lines BL1 to BLm, may be provided. Further, even-numbered cell strings, among the cell strings CS11 to CS1m or CS21 to CS2m arranged in a row direction, may be coupled to the even-numbered bit lines, respectively, and odd-numbered cell strings, among the cell strings CS11 to CS1m or CS21 to CS2m arranged in the row direction, may be coupled to the odd-numbered bit lines, respectively. For example, the even-numbered bit lines BLe1, BLe2, BLe3, . . . , BLek and odd-numbered bit lines BLo1, BLo2, BLo3, . . . , BLok of FIG. 2 may be provided.

In an embodiment, one or more of the first to n-th memory cells MC1 to MCn may be used as dummy memory cells. For example, dummy memory cell(s) are provided to reduce an electric field between the source select transistor SST and the memory cells MC1 to MCp. Alternatively, the dummy memory cell(s) are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer dummy memory cells are provided, the size of the memory block BLKa is reduced, but the reliability of the operation of the memory block BLKa may be deteriorated.

In order to efficiently control the dummy memory cell(s), each may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
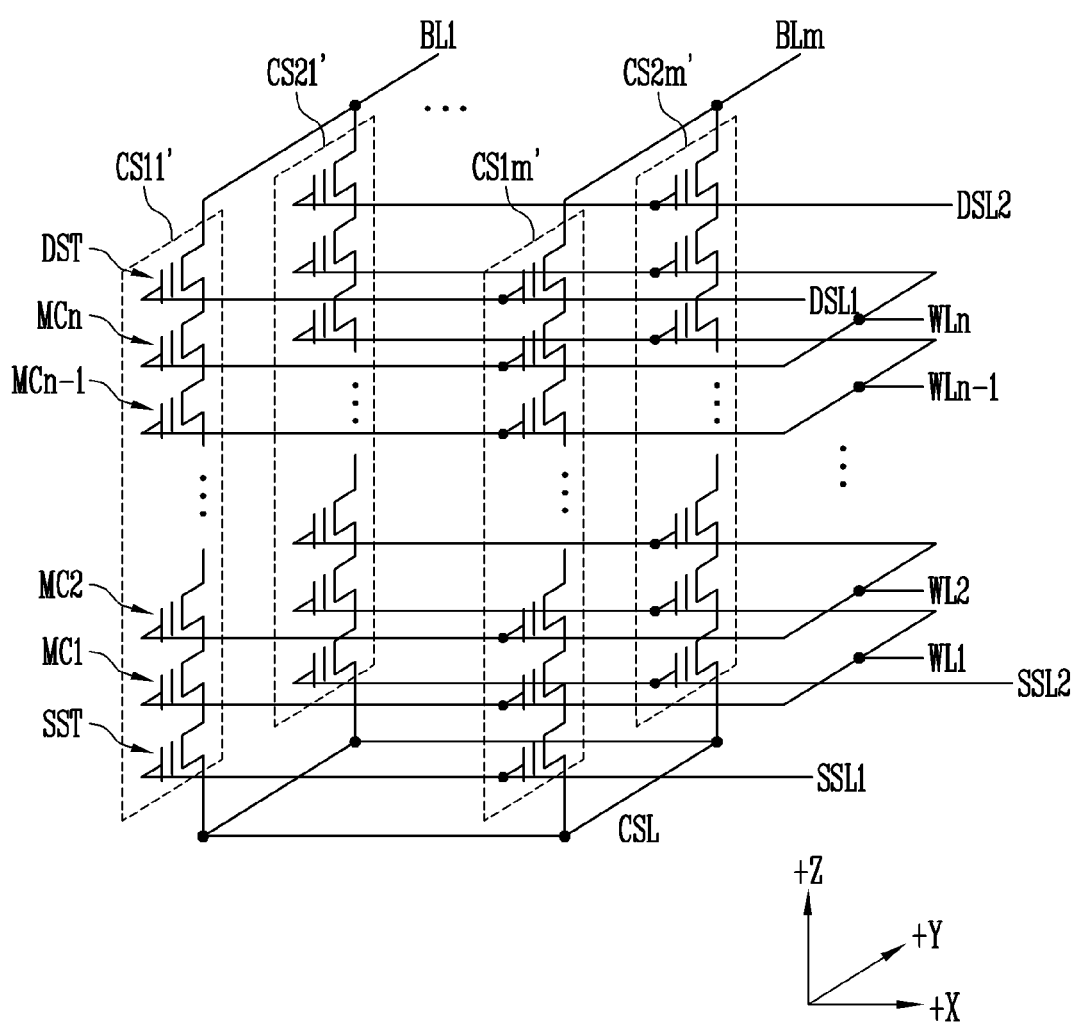
FIG. 5 is a circuit diagram illustrating an exemplary memory block BLKb, which may be any of the memory blocks BLK1 to BLKz in FIG. 3.

FIG. 5 is a circuit diagram illustrating an exemplary memory block BLKb, which may be any of the memory blocks BLK1 to BLKz in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' is extended along a positive Z (+Z) direction. Each of the cell strings CS11' to CS1m' and CS21' to CS2m' may include at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has an equivalent circuit similar to that of the memory block BLKa of FIG. 4 except that a pipe transistor PT is excluded from each cell string.

In an embodiment, even-numbered bit lines and odd-numbered bit lines, instead of first to m-th bit lines BL1 to BLm, may be provided. Further, even-numbered cell strings, among the cell strings CS11' to CS1m' or CS21' to CS2m' arranged in a row direction, may be coupled to the even-numbered bit lines, respectively, and odd-numbered cell strings, among the cell strings CS11' to CS1m' or CS21' to CS2m' arranged in the row direction, may be coupled to the odd-numbered bit lines, respectively. For example, the even-numbered bit lines BLe1, BLe2, BLe3, . . . , BLek and odd-numbered bit lines BLo1, BLo2, BLo3, . . . , BLok of FIG. 2 may be provided.

In an embodiment, one or more of the first to n-th memory cells MC1 to MCn may be used as dummy memory cells. For example, the dummy memory cell(s) are provided to reduce an electric field between the source select transistor SST and the memory cells MC1 to MCn. Alternatively, the dummy memory cell(s) are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer dummy memory cells are provided, the size of the memory block BLKb is reduced, but the reliability of the operation of the memory block BLKb may be deteriorated.

In order to efficiently control the dummy memory cell(s), each may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 6:
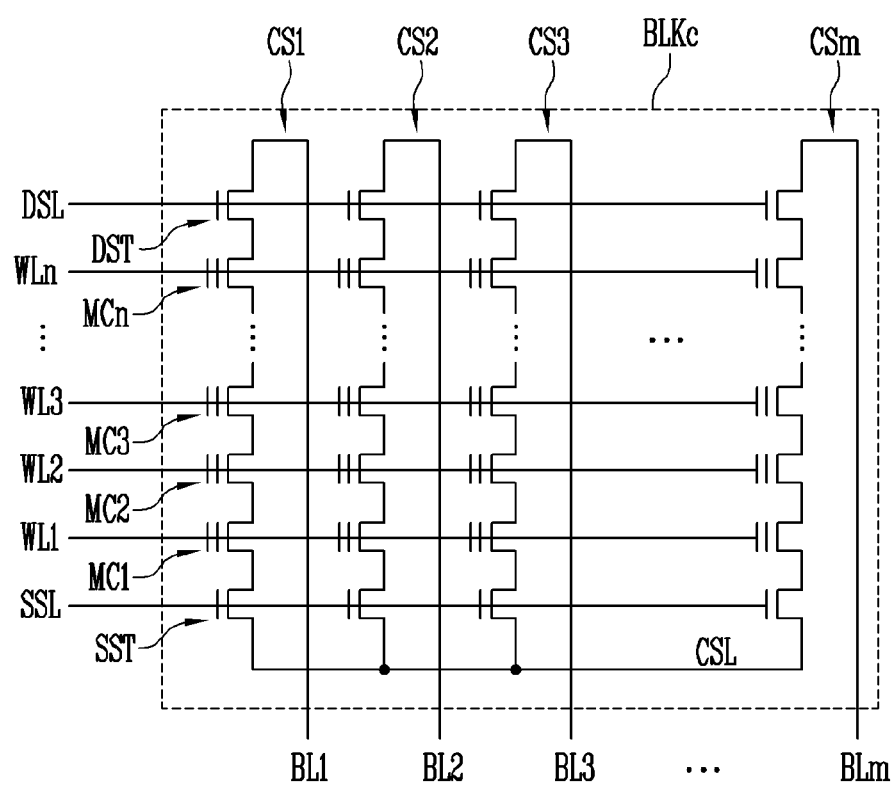
FIG. 6 is a circuit diagram illustrating an exemplary memory block BLKc, which may be any of the memory blocks BLK1 to BLKz in the memory cell array 110 of FIG. 2.

FIG. 6 is a circuit diagram illustrating an exemplary memory block BLKc, which may be any of the memory blocks BLK1 to BLKz in the memory cell array 110 of FIG. 2.

Referring to FIG. 6, the memory block BLKc may include a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting any one of the word lines WL1 to WLn.

In other embodiments, even-numbered bit lines and odd-numbered bit lines may be provided instead of the first to m-th bit lines BL1 to BLm. Among the cell strings CS1 to CSm, even-numbered cell strings may be coupled to the even-numbered bit lines, respectively, and odd-numbered cell strings may be coupled to the odd-numbered bit lines, respectively. For example, the even-numbered bit lines BLe1, BLe2, BLe3, . . . , BLek and odd-numbered bit lines BLo1, BLo2, BLo3, . . . , BLok of FIG. 2 may be provided.

Figure 7:
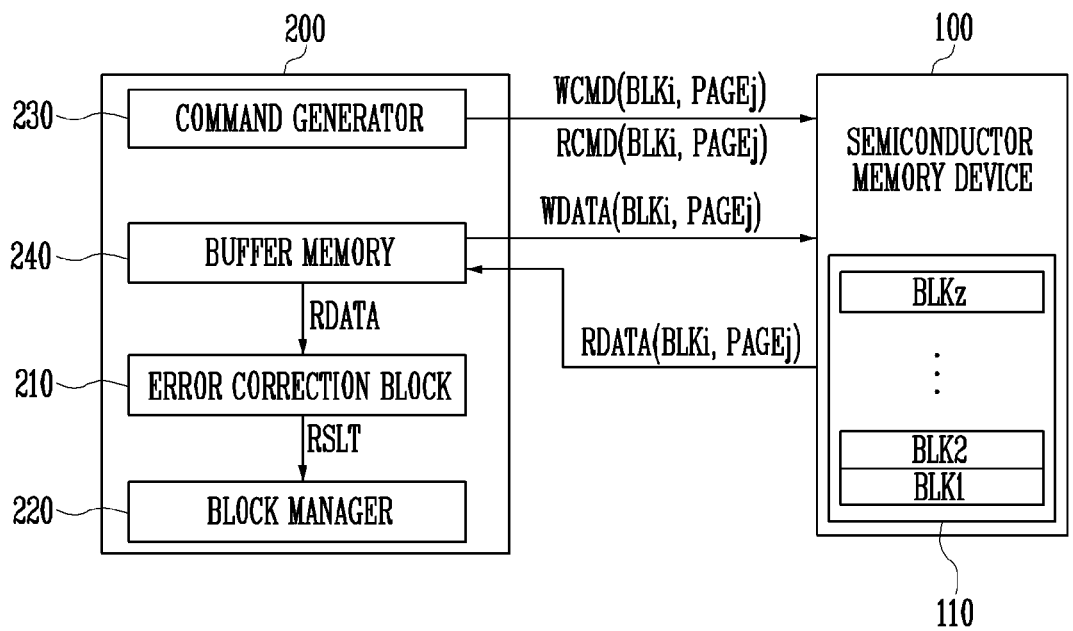
FIG. 7 is a block diagram illustrating a controller in accordance with an embodiment of the present disclosure.

FIG. 7 is a block diagram illustrating a detailed configuration of a controller, e.g., the controller 200 of FIG. 1, in accordance with an embodiment of the present disclosure.

Referring to FIG. 7, the controller 200 may include an error correction block 210, a block manager 220, a command generator 230, and a buffer memory 240. The command generator 230 may generate a program command WCMD for controlling a program operation of a semiconductor memory device 100 or a read command RCMD for controlling a read operation of the semiconductor memory device 100. In addition, the command generator 230 may generate an erase command for controlling an erase operation of the semiconductor memory device 100.

In an example, during a program operation, the command generator 230 may generate a program command WCMD for programming program data WDATA to a j-th physical page PAGEj of an i-th memory block BLKi of the memory cell array 110. The generated program command WCMD may be transferred to the semiconductor memory device 100. Further, the program data WDATA, stored in the buffer memory 240, may be transferred to the semiconductor memory device 100. The semiconductor memory device 100 may program the program data WDATA to the j-th physical page PAGEj of the i-th memory block BLKi of the memory cell array 110 in response to the received program command WCMD.

During a read operation, the command generator 230 may generate a read command RCMD for reading data stored in the j-th physical page PAGEj of the i-th memory block BLKi of the memory cell array 110. The generated read command RCMD may be transferred to the semiconductor memory device 100. The semiconductor memory device 100 may read the data, stored in the j-th physical page PAGEj of the i-th memory block BLKi of the memory cell array 110, in response to the received read command RCMD. The read data is transferred as read data RDATA to the controller 200.

The read data RDATA that is transferred to the controller 200 is stored in the buffer memory 240.

The error correction block 210 may detect and correct an error in the read data RDATA, stored in the buffer memory 240, using an error correction code (ECC). The read data RDATA may include a plurality of chunks, and the error detection and correction operation may be performed on a chunk basis. For each chunk, when the number of error bits is less than or equal to a reference value, the error correction block 210 may correct the error in the corresponding chunk. In contrast, for each chunk, when the number of error bits is greater than the reference value, the error correction block 210 does not correct the error in the corresponding chunk. The error correction block 210 transfers respective pieces of error correction result data RSLT for the plurality of chunks in the read data RDATA to the block manager 220.

The block manager 220 may perform defect processing on the memory block BLKi in which the read data RDATA was stored, based on the error correction result data RSLT received from the error correction block 210. In detail, when a failure in error correction (i.e., error correction failure or ECC failure) occurs in two or more chunks included in the read data RDATA, the block manager 220 performs defect processing on the memory block BLKi, in which the read data RDATA was stored. A detailed operation in which the block manager 220 performs defect processing on the memory block BLKi will be described later with reference to FIGS. 16 to 25.

Figure 8:
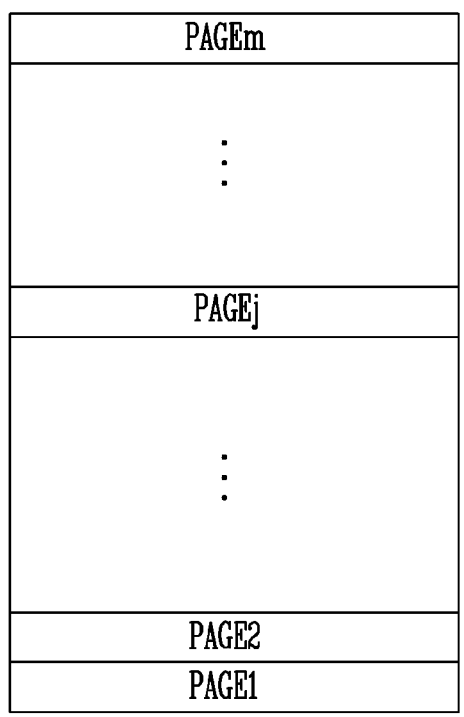
FIG. 8 is a diagram illustrating a relationship between a memory block and physical pages.

FIG. 8 is a diagram illustrating a relationship between a memory block BLKi and physical pages.

Referring to FIG. 8, the memory block BLKi includes a plurality of physical pages PAGE1 to PAGEm. Since a data program operation or read operation is performed on a page basis, the memory block BLKi and a physical page PAGEj that are the targets of operation are specified in the program operation or read operation.

FIG. 9 is a diagram illustrating a relationship between program data WDATA and chunks.

Referring to FIG. 9, the program data WDATA is transferred from the controller 200 to the semiconductor memory device 100. The program data WDATA includes a plurality of chunks CHK1 to CHK4. The program data WDATA may be data to be programmed to a physical page PAGEj of a memory block BLKi. Each chunk may be an "error correction unit" of the error correction block 210. Although an embodiment in which four chunks are included in the program data WDATA is illustrated by way of example, the present disclosure is not limited thereto. That is, if necessary, a different number of chunks may be included in the program data WDATA.

FIG. 10 is a circuit diagram illustrating a structure of a memory block of the memory blocks BLK1 to BLKz in FIG. 2. Referring to FIG. 10, each memory block includes a plurality of strings STe1 to STek and STo1 to STok which are coupled between bit lines BLe1 to BLek and BLo1 to BLok and a common source line CSL. That is, the strings STe1 to STok are coupled to the corresponding bit lines BLe1 to BLok, respectively, and are coupled in common to the common source line CSL. Each string (e.g., STe1) may include a source select transistor SST, a plurality of memory cells C1e1 to Cne1, and a drain select transistor DST. A drain of the drain select transistor DST is coupled to the corresponding bit line BLe1. A source of the source select transistor SST is coupled to the common source line CSL. The memory cells C1e1 to Cne1 are coupled in series between the select transistors SST and DST. A gate of the source select transistor SST is coupled to a source select line SSL. Gates of the memory cells C1e1 to Cne1 are coupled to the word lines WL1 to WLn, respectively. A gate of the drain select transistor DST is coupled to a drain select line DSL.

The memory cells included in the memory block of the semiconductor memory device 100 may be divided into physical page units or logical page units. For example, memory cells C1e1 to C1ek and C1o1 to C1ok coupled to one-word line (e.g., WL1) constitute one physical page PAGE1. Also, even-numbered memory cells C1e1 to C1ek coupled to one-word line (e.g., WL1) may constitute one even-numbered physical page, and odd-numbered memory cells C1o1 to C1ok may constitute one odd-numbered physical page. Such a page (or an even-numbered page and an odd-numbered page) may be a basic unit by which a program operation or a read operation is performed.

Referring back to FIG. 2, the read and write circuit 130 may include a plurality of page buffers PB1 to PBk coupled to the memory cell array 110 through the bit lines BLe1 to BLek and BLo1 to BLok. The page buffers PB1 to PBk may selectively precharge the bit lines BLe1 to BLek or BLo1 to BLok in accordance with input data so as to store data in the memory cells C1e1 to C1ek or C1o1 to C1ok. The page buffers PB1 to PBk may sense the voltages of the bit lines BLe1 to BLek or BLo1 to BLok so as to read data from the memory cells C1e1 to C1ek or C1o1 to C1ok.

For example, when program data (e.g., data '0') to be stored in the memory cell C1e1 is input to the page buffer PB1, the page buffer PB1 applies a program-permission voltage (e.g., ground voltage) to the bit line BLe1 of the memory cell C1e1 in which the program data is to be stored during a program operation. As a result, the threshold voltage of the memory cell C1e1 is increased due to a program voltage that is applied to the word line WL1 and the program-permission voltage that is applied to the bit line BLe1 during the program operation. Further, when erase data (e.g., data '1') to be stored in the memory cell C1e1 is input to the page buffer PB1, the page buffer PB1 applies a program-inhibition voltage (e.g., supply voltage) to the bit line BLe1 of the memory cell C1e1 in which the erase data is to be stored during the program operation. As a result, even if a program voltage Vpgm is applied to the word line WL1 during the program operation, the threshold voltage of the memory cell C1e1 is not increased due to the program-inhibition voltage that is applied to the bit line BLe1. Since the threshold voltage varies, different pieces of data may be stored in the corresponding memory cell.

During a read operation, the read and write circuit 130 may precharge all of bit lines (e.g., BLe1 to BLek) selected from among the even-numbered bit lines BLe1 to BLek and the odd-numbered bit lines BLo1 to BLok, and may discharge all of unselected bit lines (e.g., BLo1 to BLok). Further, when a read voltage is applied to the selected word line WL1, the bit lines of memory cells in which program data is stored are maintained in a precharged state, and the bit lines of memory cells in which erase data is stored are discharged. The read and write circuit 130 may sense changes in the voltages of the bit lines BLe1 to BLek, and may latch the data of the memory cells corresponding to the sensed result.

The column decoder 160 may select the page buffers PB1 to PBk included in the read and write circuit 130 in response to a column address signal output from the control logic 140. That is, the column decoder 160 sequentially transfers data to be stored in the memory cells to the page buffers PB1 to PBk in response to the column address signal. Further, the column decoder 160 sequentially selects the page buffers PB1 to PBk in response to the column address signal so that the data of the memory cells, latched in the page buffers PB1 to PBk, is output to the outside of the page buffers through a read operation.

In this way, when a program operation or a read operation is performed on the memory cells C1e1 to C1ek coupled to the even-numbered bit lines BLe1 to BLek, the odd-numbered bit lines BLo1 to BLok are not selected. Further, when a program operation or a read operation is performed on the memory cells C1o1 to C1ok coupled to the odd-numbered bit lines BLo1 to BLok, the even-numbered bit lines BLe1 to BLek are not selected.

FIGS. 11A to 11D are diagrams illustrating a process in which data is programmed to each memory cell depending on the memory block structure. Program data WDATA includes first to fourth chunks CHK1 to CHK4. Also, a j-th physical page PAGEj includes first to k-th even-numbered memory cells Cje1 to CjeK and first to k-th odd-numbered memory cells Cjo1 to Cjok. In detail, in FIGS. 11A to 11D, an embodiment is illustrated in which the first and second chunks CHK1 and CHK2 are stored in the even-numbered memory cells Cje1 to Cjek of the j-th physical page PAGEj, and the third and fourth chunks CHK3 and CHK4 are stored in the odd-numbered memory cells Cjo1 to Cjok of the j-th physical page PAGEj.

Figure 11A:
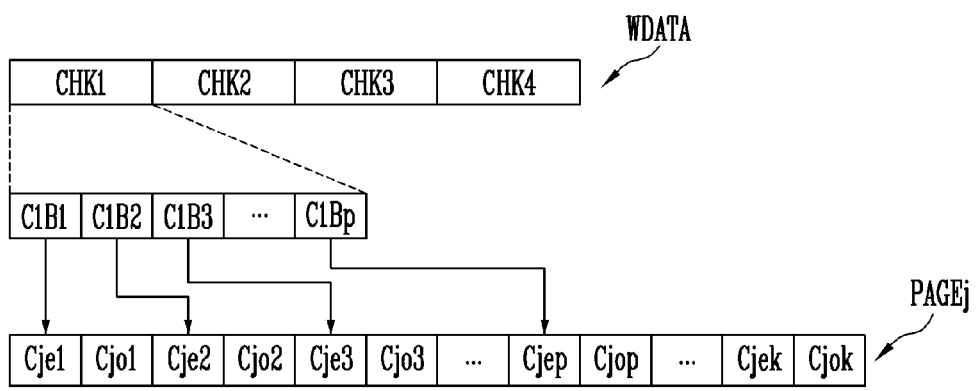
FIGS. 11A to 11D are diagrams illustrating a process in which data is programmed to each memory cell depending on the structure of the memory block in FIG. 10.

Referring to FIG. 11A, memory cells in which data of the first chunk CHK1 contained in the program data WDATA is stored are illustrated as an example. The first chunk CHK1 may include first to p-th bits C1B1 to C1Bp. The bits C1B1 to C1Bp of the first chunk CHK1 may be respectively programmed to the first to p-th even-numbered memory cells Cje1 to Cjep coupled to the first to p-th even-numbered bit lines BLe1 to BLep among the even-numbered bit lines BLe1 to BLek.

Figure 11B:
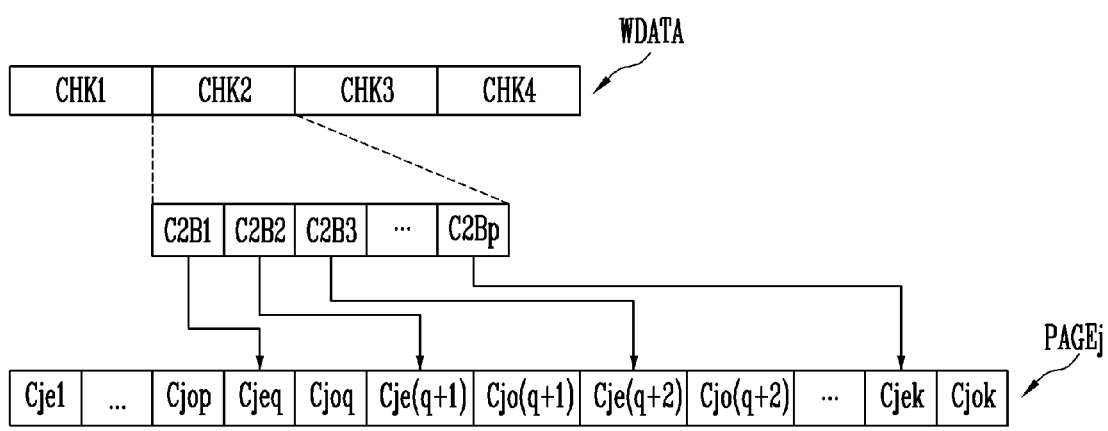

Referring to FIG. 11B, memory cells in which data of the second chunk CHK2 contained in the program data WDATA is stored are illustrated as an example. The second chunk CHK2 may include first to p-th bits C2B1 to C2Bp. The bits C2B1 to C2Bp of the second chunk CHK2 may be respectively programmed to the q-th to k-th even-numbered memory cells Cjeq to Cjek coupled to the q-th to k-th even-numbered bit lines BLeq to BLek among the even-numbered bit lines BLe1 to BLek. Here, the q-th even-numbered memory cell Cjeq is an even-numbered memory cell disposed subsequent to the p-th even-numbered memory cell Cjep. Accordingly, bits of the first chunk CHK1 and the second chunk CHK2 are programmed to the even-numbered memory cells Cje1 to Cjek among the memory cells of the physical page PAGEj.

Figure 11C:
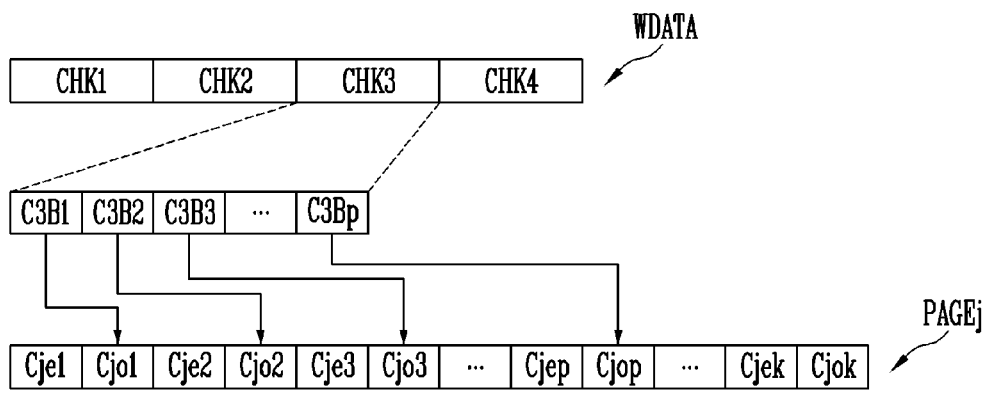

Referring to FIG. 11C, memory cells in which data of the third chunk CHK3 contained in the program data WDATA is stored are illustrated as an example. The third chunk CHK3 may include first to p-th bits C3B1 to C3Bp. The bits C3B1 to C3Bp of the third chunk CHK3 may be respectively programmed to the first to p-th odd-numbered memory cells Cjo1 to Cjop coupled to the first to p-th odd-numbered bit lines BLo1 to BLop among the odd-numbered bit lines BLo1 to BLok.

Figure 11D:
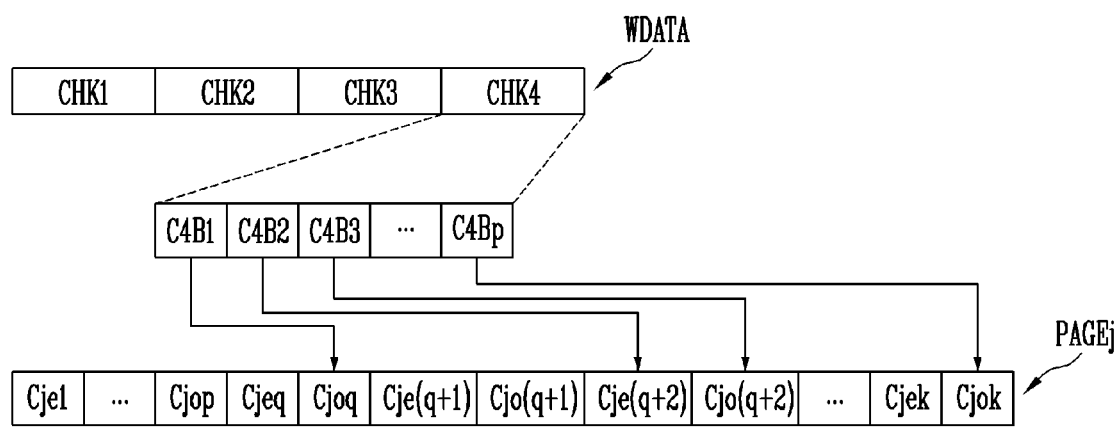

Referring to FIG. 11D, memory cells in which data of the fourth chunk CHK4 contained in the program data WDATA is stored are illustrated as an example. The fourth chunk CHK4 may include first to p-th bits C4B1 to C4Bp. The bits C4B1 to C4Bp of the fourth chunk CHK4 may be respectively programmed to the q-th to k-th odd-numbered memory cells Cjoq to Cjok coupled to the q-th to k-th odd-numbered bit lines BLoq to BLok among the odd-numbered bit lines BLo1 to BLok. Here, the q-th odd-numbered memory cell Cjoq is an odd-numbered memory cell disposed subsequent to the p-th odd-numbered memory cell Cjop. Accordingly, bits of the third chunk CHK3 and the fourth chunk CHK4 are respectively programmed to the odd-numbered memory cells Cjo1 to Cjok among the memory cells of the physical page PAGEj.

FIGS. 12A to 12D are diagrams illustrating a process in which data is programmed to each memory cell depending on the memory block structure. In detail, in FIGS. 12A to 12D, an embodiment is illustrated in which first and third chunks CHK1 and CHK3 are stored in even-numbered memory cells Cje1 to CjeK of a j-th physical page PAGEj, and second and fourth chunks CHK2 and CHK4 are stored in odd-numbered memory cells Cjo1 to Cjok of the j-th physical page PAGEj.

Figure 12A:
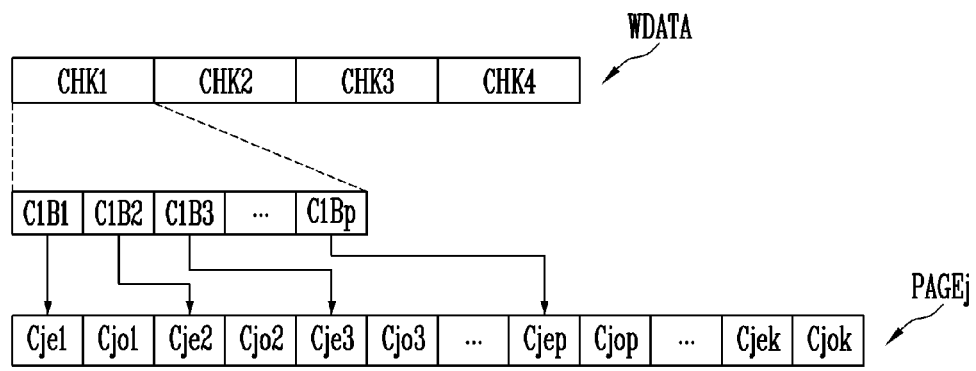
FIGS. 12A to 12D are diagrams illustrating a process in which data is programmed to each memory cell depending on the structure of the memory block in FIG. 10.

Referring to FIG. 12A, memory cells in which data of the first chunk CHK1 contained in the program data WDATA is stored are illustrated as an example. The first chunk CHK1 may include first to p-th bits C1B1 to C1Bp. The bits C1B1 to C1Bp of the first chunk CHK1 may be respectively programmed to the first to p-th even-numbered memory cells Cje1 to Cjep coupled to first to p-th even-numbered bit lines BLe1 to BLep among even-numbered bit lines BLe1 to BLek.

Figure 12B:
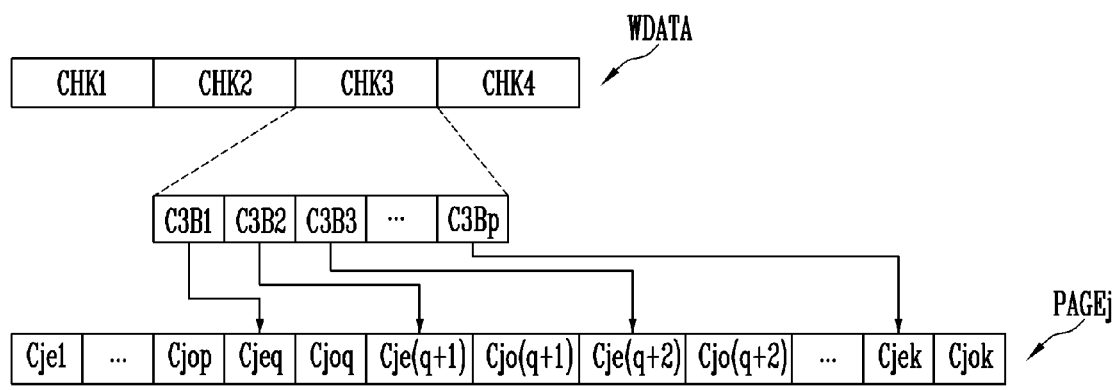

Referring to FIG. 12B, memory cells in which data of the third chunk CHK3 contained in the program data WDATA is stored are illustrated as an example. The third chunk CHK3 may include first to p-th bits C3B1 to C3Bp. The bits C3B1 to C3Bp of the third chunk CHK3 may be respectively programmed to the q-th to k-th even-numbered memory cells Cjeq to Cjek coupled to the q-th to k-th even-numbered bit lines BLeq to BLek among the even-numbered bit lines BLe1 to BLek. Here, the q-th even-numbered memory cell Cjeq is an even-numbered memory cell disposed subsequent to the p-th even-numbered memory cell Cjep. Accordingly, bits of the first chunk CHK1 and the third chunk CHK3 are respectively programmed to the even-numbered memory cells Cje1 to Cjek among the memory cells of the physical page PAGEj.

Figure 12C:
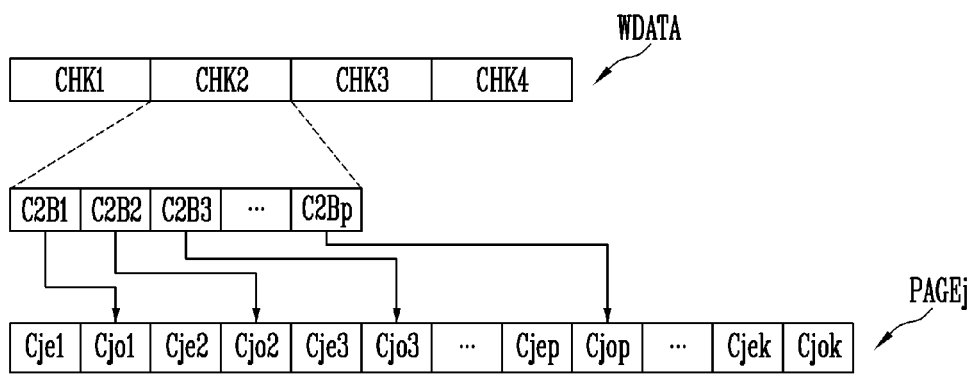

Referring to FIG. 12C, memory cells in which data of the second chunk CHK2 contained in the program data WDATA is stored are illustrated as an example. The second chunk CHK2 may include first to p-th bits C2B1 to C2Bp. The bits C2B1 to C2Bp of the second chunk CHK2 may be respectively programmed to the first to p-th odd-numbered memory cells Cjo1 to Cjop coupled to the first to p-th odd-numbered bit lines BLo1 to BLop among the odd-numbered bit lines BLo1 to BLok.

Figure 12D:
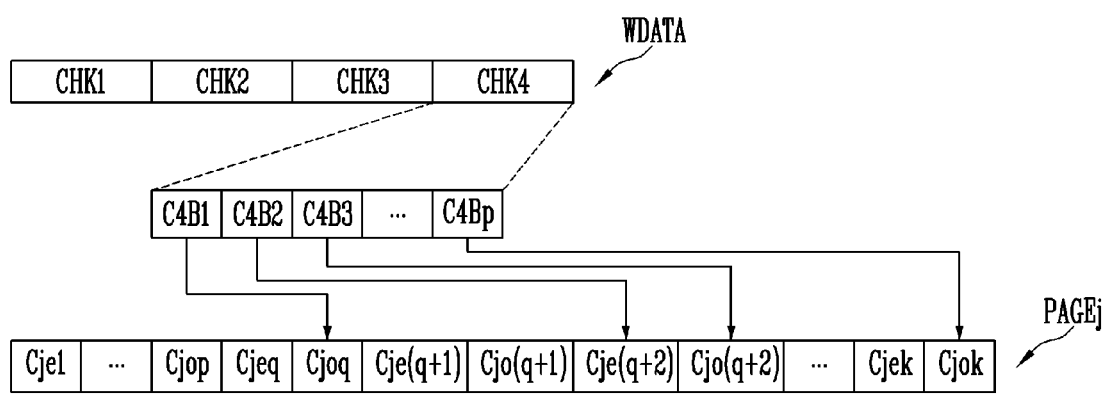

Referring to FIG. 12D, memory cells in which data of the fourth chunk CHK4 contained in the program data WDATA is stored are illustrated as an example. The fourth chunk CHK4 may include first to p-th bits C4B1 to C4Bp. The bits C4B1 to C4Bp of the fourth chunk CHK4 may be respectively programmed to the q-th to k-th odd-numbered memory cells Cjoq to Cjok coupled to the q-th to k-th odd-numbered bit lines BLoq to BLok among the odd-numbered bit lines BLo1 to BLok. Here, the q-th odd-numbered memory cell Cjoq is an odd-numbered memory cell disposed subsequent to the p-th odd-numbered memory cell Cjop. Accordingly, bits of the second chunk CHK2 and the fourth chunk CHK4 are respectively programmed to the odd-numbered memory cells Cjo1 to Cjok among the memory cells of the physical page PAGEj.

FIGS. 11A to 11D and 12A to 12D are shown to explain examples in which pieces of data of respective chunks are programmed to even-numbered memory cells or odd-numbered memory cells. Unlike those examples, bit data of chunks contained in the program data WDATA may be programmed to even-numbered memory cells or odd-numbered memory cells using various schemes.

Figure 13:
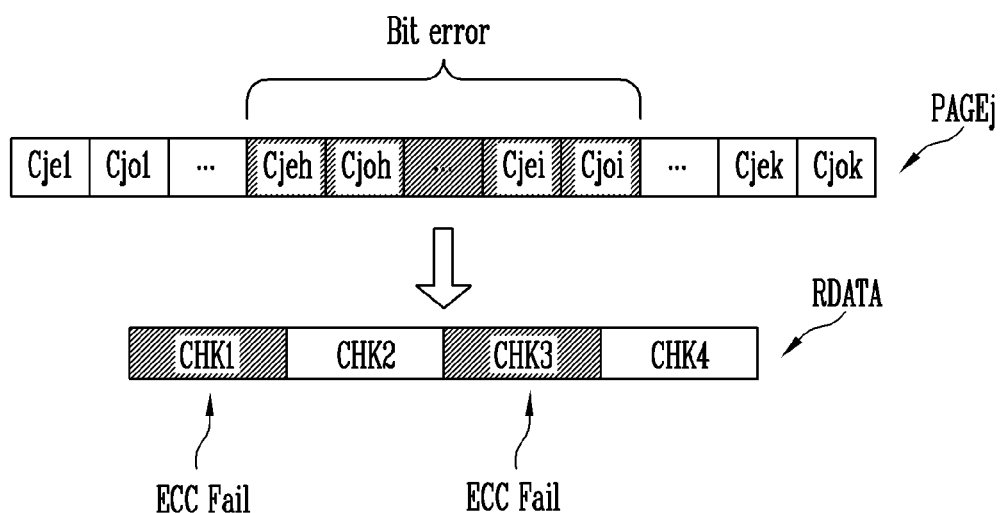
FIG. 13 is a diagram illustrating aspects of an error correction failure in individual chunks when bit errors occur due to a defect in a memory block.

FIG. 13 is a diagram illustrating aspects of an error correction failure in individual chunks when bit errors occur due to a defect in a memory block. In detail, FIG. 13 illustrates a failure in error correction of read data RDATA attributable to the occurrence of bit errors in an embodiment in which data of first and second chunks CHK1 and CHK2 is programmed to even-numbered memory cells Cje1 to Cjek and data of third and fourth chunks CHK3 and CHK4 is programmed to odd-numbered memory cells Cjo1 to Cjok, as illustrated in FIGS. 11A to 11D.

The occurrence of bit errors due to a defect in a memory block may result in bit errors in memory cells successively located in the physical page PAGEj. In FIG. 13, a state in which bit errors occur in an h-th even-numbered memory cell Cjeh to an i-th odd-numbered memory cell Cjoi, which are successively located, is depicted. That is, the memory cells Cjeh to Cjoi in which the bit errors have occurred are indicated by hatched lines. Here, the i-th odd-numbered memory cell Cjoi is located to the left of the q-th even-numbered memory cell Cjeq illustrated in FIGS. 11A to 11D.

In this case, data stored in the memory cells Cjeh to Cjoi in which bit errors have occurred is included in the first chunk CHK1 or the third chunk CHK3. When the number of bit errors that have occurred is relatively small, an error correction operation on the data of the first and third chunks CHK1 and CHK3 may succeed. However, when the number of bit errors included in each of the first and third chunks CHK1 and CHK3 is greater than the number of bit errors that can be corrected by the error correction block 210 of FIG. 7, error correction in the data of the first and third chunks CHK1 and CHK3 will fail (i.e., ECC fail), as illustrated in FIG. 13. The chunks in which error correction has failed are indicated by hatched lines.

Figure 14:
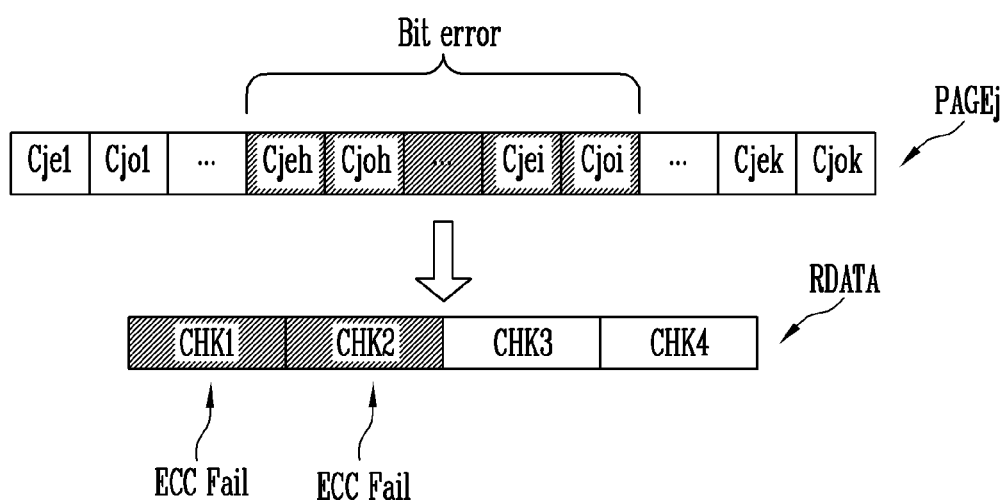
FIG. 14 is a diagram illustrating aspects of an error correction failure in individual chunks when bit errors occur due to a defect in a memory block.

FIG. 14 is a diagram illustrating aspects of an error correction failure in individual chunks when bit errors occur due to a defect in a memory block. In detail, FIG. 14 illustrates a failure in error correction of read data RDATA attributable to the occurrence of bit errors in an embodiment in which data of first and third chunks CHK1 and CHK3 is programmed to even-numbered memory cells Cje1 to Cjek and data of second and fourth chunks CHK2 and CHK4 is programmed to odd-numbered memory cells Cjo1 to Cjok, as illustrated in FIGS. 12A to 12D.

The occurrence of bit errors due to a defect in a memory block may result in bit errors in memory cells successively located in the physical page PAGEj. In FIG. 14, a state in which bit errors occur in an h-th even-numbered memory cell Cjeh to an i-th odd-numbered memory cell Cjoi, which are successively located, is depicted. Here, the i-th odd-numbered memory cell Cjoi is located to the left of the q-th even-numbered memory cell Cjeq illustrated in FIGS. 12A to 12D.

In this case, data stored in the memory cells Cjeh to Cjoi in which bit errors have occurred is included in the first chunk CHK1 or the second chunk CHK2. When the number of bit errors that have occurred is relatively small, an error correction operation on the data of the first and second chunks CHK1 and CHK2 may succeed. However, when the number of bit errors included in each of the first and second chunks CHK1 and CHK2 is greater than the number of bit errors that can be corrected by the error correction block 210 of FIG. 7, error correction in the data of the first and second chunks CHK1 and CHK2 will fail (i.e., ECC fail), as illustrated in FIG. 14.

As described above, in the structure in which even-numbered memory cells and odd-numbered memory cells are separately operated, an error correction failure (i.e., ECC fail) occurs in at least two chunks when bit errors occur due to a defect in a memory block. The reason for this is that successively located memory cells are configured to store pieces of data of different chunks. It can be seen that it is highly likely that, when an error correction failure occurs only in one chunk, bit errors attributable to causes other than a defect in a memory block have occurred. For example, when an error occurs in an operation in which program data WDATA is transferred from the controller 200 to the semiconductor memory device 100 or in which read data RDATA is transferred from the semiconductor memory device 100 to the controller 200, an error correction failure may occur only in one chunk. However, such a bit error is not related to a defect in a memory block.

Typically, when an error correction failure occurs in at least one chunk of read data, a memory block to which the corresponding read data is programmed, that is, target data, is processed as a bad block. However, when an error correction failure occurs only in one chunk, as in the above case, it is highly likely that bit errors occurred as a result of causes other than the defect in the memory block.

Therefore, in accordance with an embodiment of the present disclosure, a bad block processing operation is performed by distinguishing between a case where an error correction failure occurs only in one chunk, among a plurality of chunks in read data, as a result of error correction, and a case where an error correction failure occurs in two or more chunks, among a plurality of chunks in read data, as a result of error correction.

In an embodiment, when an error correction failure occurs in two or more chunks, the corresponding memory block is immediately processed as a bad block. In contrast, when an error correction failure occurs only in one chunk, the corresponding memory block continues to be used because there is a strong possibility that bit errors did not occur due to a physical defect in the memory block.

In an embodiment, when an error correction failure occurs in two or more chunks, the corresponding memory block may be immediately processed as a bad block. However, when an error correction failure occurs only in one chunk, an additional defect test may be performed without the memory block being immediately processed as a bad block, in which case the corresponding memory block may be processed as a bad block based on the result of the additional defect test.

Accordingly, in accordance with an embodiment of the present disclosure, the corresponding memory block is processed as a bad block only when there is a strong possibility that, when an error correction failure occurs, the cause of the failure is actually due to a physical defect in the memory block, thus enabling the memory blocks in the memory cell array 110 to be more efficiently used.

Figure 15:
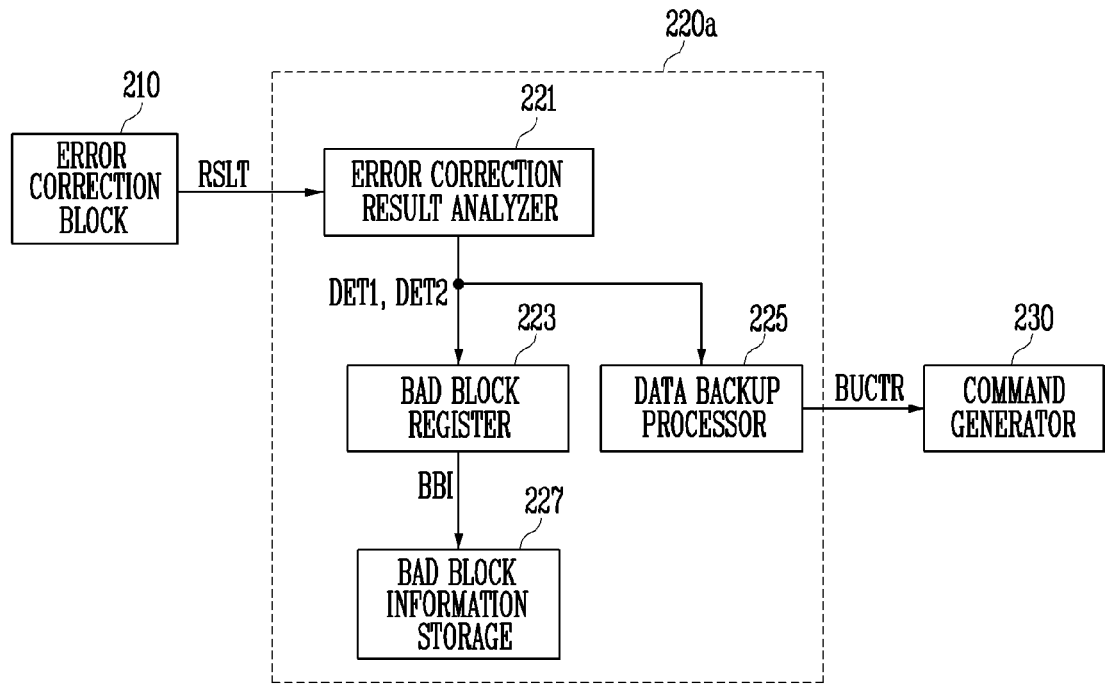
FIG. 15 is a block diagram illustrating a block manager in accordance with an embodiment of the present disclosure.

FIG. 15 is a block diagram illustrating a block manager 220a in accordance with an embodiment of the present disclosure. The block manager 220a of FIG. 15 is an example of the block manager 220 of FIG. 7.

Referring to FIG. 15, the block manager 220a may include an error correction result analyzer 221, a bad block register 223, a data backup processor 225, and a bad block information storage 227.

The error correction result analyzer 221 receives error correction result data RSLT from an error correction block 210. The error correction result data RSLT may include information indicating whether an error correction operation on each of a plurality of chunks CHK1 to CHK4 included in read data RDATA has succeeded or failed. When an error correction failure is detected in the error correction result data RSLT, the error correction result analyzer 221 transfers the result of detection to the bad block register 223 and the data backup processor 225. In detail, when an error correction operation fails only in one of the plurality of chunks, the error correction result analyzer 221 transmits first detection data DET1 to the bad block register 223 and the data backup processor 225. When an error correction operation fails in two or more of the plurality of chunks, the error correction result analyzer 221 transmits second detection data DET2 to the bad block register 223 and the data backup processor 225.

The bad block register 223 performs defect processing on the memory block in which the read data RDATA was stored in response to the second detection data DET2. Accordingly, bad block information BBI is transferred to the bad block information storage 227. The bad block information storage 227 registers the corresponding memory block as a bad block in response to the received bad block information BBI. In an example, the bad block information storage 227 may store a bad block list including the addresses of bad blocks. In this case, the bad block information storage 227 may add the memory block, in which the read data RDATA was stored, to the bad block list based on the received bad block information BBI.

The data backup processor 225 may generate a backup control signal BUCTR for data backup processing related to the read data RDATA, and may transfer the backup control signal BUCTR to the command generator 230. The command generator 230 may generate a command for a data backup operation based on the received backup control signal BUCTR. A backup operation of the semiconductor memory device 100 of FIG. 7 based on the control of the data backup processor 225 will be described later with reference to FIGS. 17 to 19.

Figure 16:
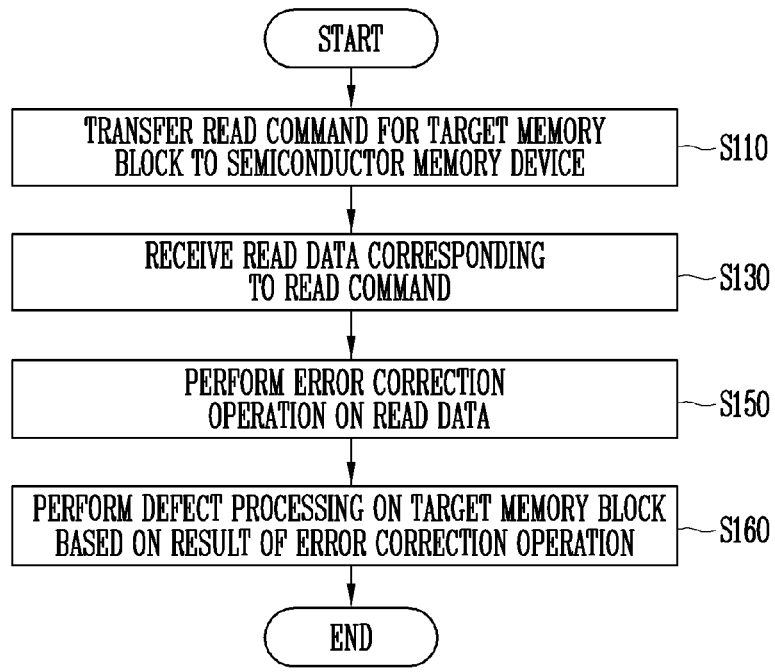
FIG. 16 is a flowchart illustrating a method of operating a controller in accordance with an embodiment of the present disclosure.

FIG. 16 is a flowchart illustrating a method of operating a controller, e.g., the controller 200 of FIG. 7, in accordance with an embodiment of the present disclosure.

Referring to FIG. 16, the method includes steps S110, S130, S150 and S160. The step S110 may include transferring a read command for a target memory block to a semiconductor memory device. The step S130 may include receiving read data corresponding to the read command. The step S150 may include performing an error correction operation on the read data. The step S160 may include performing defect processing on the target memory block based on the result of the error correction operation.

At step S110, the command generator 230 of FIG. 15 generates a read command RCMD for reading the data stored at a specific position (e.g., BLKi or PAGEj), and transfers the generated read command RCMD to the semiconductor memory device 100. Here, the memory block BLKi that is the target of a read operation may be referred to as a "target memory block". In response to the read command RCMD transferred at step S110, the semiconductor memory device 100 may perform a read operation on the physical page PAGEj of the target memory block BLKi.

Thereafter, the semiconductor memory device 100 transfers the read data RDATA, which is the result of the read operation, to the controller 200. At step S130, the controller 200 may receive the read data, and may store the read data in the buffer memory 240.

Thereafter, at step S150, the error correction block 210 performs an error correction operation on the read data RDATA. Error correction result data RSLT, generated after the error correction operation, is transferred to the block manager 220a. Then, at step S160, the block manager 220a performs defect processing on the target memory block based on the error correction result data RSLT. In particular, at step S160, the block manager 220a may analyze the error correction result data RSLT, and may distinguish between a case where an error correction failure occurs only in one chunk and a case where an error correction failure occurs in two or more chunks to separately perform the bad block processing operation.

Examples of step S160 are described below with reference to FIGS. 17 and 24.

Figure 17:
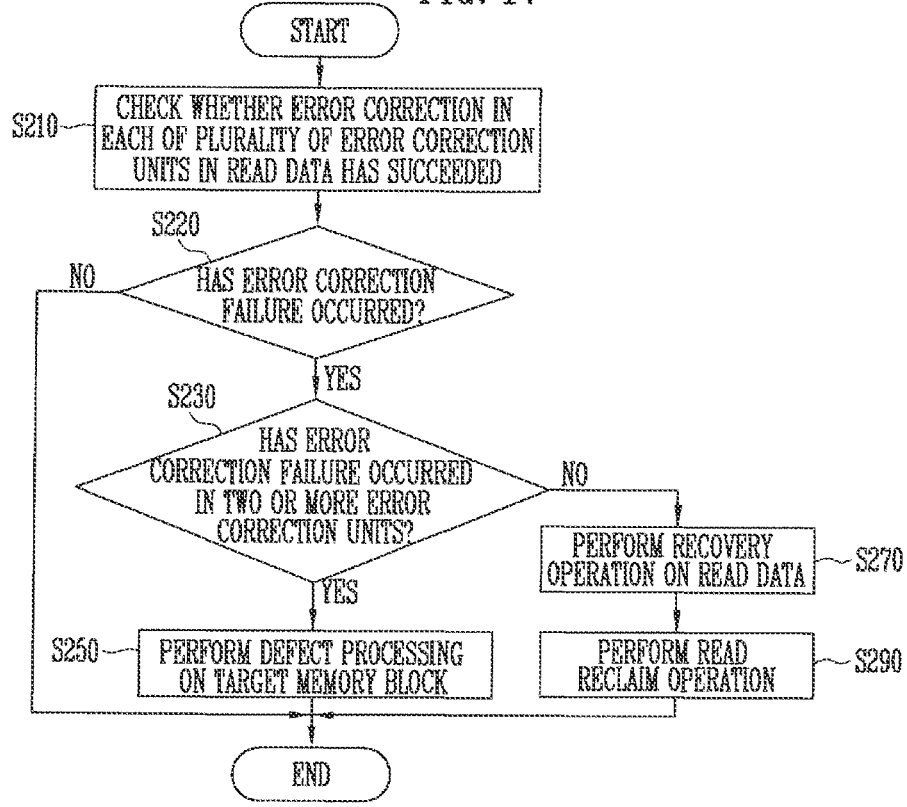
FIG. 17 is a flowchart illustrating an example of step S160 in FIG. 16.

FIG. 17 is a flowchart illustrating an example of step S160 in FIG. 16.

Referring to FIG. 17, the step S160 of performing defect processing on the target memory block based on the result of the error correction operation includes the step S210, step S220, step S230, step S240, step S270 and step S290. The step S210 may include determining or checking whether error correction in each of a plurality of error correction units in the read data RDATA has succeeded. The step S220 may include determining whether an error correction failure has occurred. The step S230 may include determining whether an error correction failure has occurred in two or more error correction units. When it is determined that the error correction failure has occurred in two or more error correction units (S230, YES), step S250 may be performed. The step S250 may include performing defect processing on the target memory block. In contrast, when it is determined that the error correction failure has not occurred in two or more error correction units (S230, NO), step S270 and step S290 may be performed. The step S270 may include performing a recovery operation on the read data. The step S290 may include performing a read reclaim operation.

At step S210, the error correction result analyzer 221 of FIG. 15 may analyze the error correction result data RSLT received from the error correction block 210. Further, the error correction result analyzer 221 may check whether error correction in each of the plurality of chunks CHK1 to CHK4 in the read data RDATA has succeeded.

Thereafter, the error correction result analyzer 221 determines whether an error correction failure has occurred in the read data RDATA at step S220. When it is determined that an error correction failure has not occurred in the read data RDATA (S220, NO), it may be considered that the read data RDATA has been normally read, and thus step S160 is terminated.

When it is determined that an error correction failure has occurred (S220, YES), the error correction result analyzer 221 determines whether the error correction failure has occurred in two or more error correction units at step S230. The term "error correction unit" may denote a chunk, described above with reference to FIGS. 9 to 14.

When it is determined that the error correction failure has occurred in two or more error correction units (S230, YES), defect processing is performed on the target memory block at step S250. In detail, the error correction result analyzer 221 transmits second detection data DET2 to the bad block register 223 and the data backup processor 225. The bad block register 223 and the data backup processor 225 may perform a defect processing operation on the target memory block in response to the received second detection data DET2. A detailed configuration of the defect processing operation will be described later with reference to FIG. 18.

In contrast, when it is determined that the error correction failure has not occurred in two or more error correction units (S230, NO), it may be considered that the error correction failure has occurred only in one error correction unit. The error correction result analyzer 221 transmits first detection data DET1 to the data backup processor 225.

At step S270, the data backup processor 225 performs a recovery operation on the read data in response to the received first detection data DET1. The recovery operation performed at step S270 may include an operation of recovering data that cannot be corrected by the error correction block. For example, at step S270, the read data may be recovered using a chip-kill scheme. In other embodiments, the read data that has failed in error correction may be recovered through various schemes other than the chip-kill scheme. The data backup processor 225 may transmit a control signal for generating commands required for the data recovery operation to the command generator 230. The command generator 230 may generate commands for recovering the read data RDATA in response to the control signal output from the data backup processor 225.

At step S270, the recovered data may be transferred to the host 300.

At step S290, a read reclaim operation is performed using the recovered read data. The read reclaim operation performed at step S290 will be described in detail later with reference to FIG. 19 or 21.

In FIG. 17, an embodiment is illustrated in which step S270 and S290 are performed when it is determined that the error correction failure has not occurred in two or more error correction units (S230, NO), that is, when the error correction failure has occurred in one error correction unit. In other embodiments, neither step S270 nor S290 may be performed. In this case, when it is determined that the error correction failure has occurred only in one error correction unit (S230, NO), a read failure message for the corresponding read data may be sent to the host 300, after which the operation may be terminated. Even in this embodiment, when it is determined that the error correction failure has occurred only in one error correction unit (S230, NO), defect processing is not performed on the target memory block.

Figure 18:
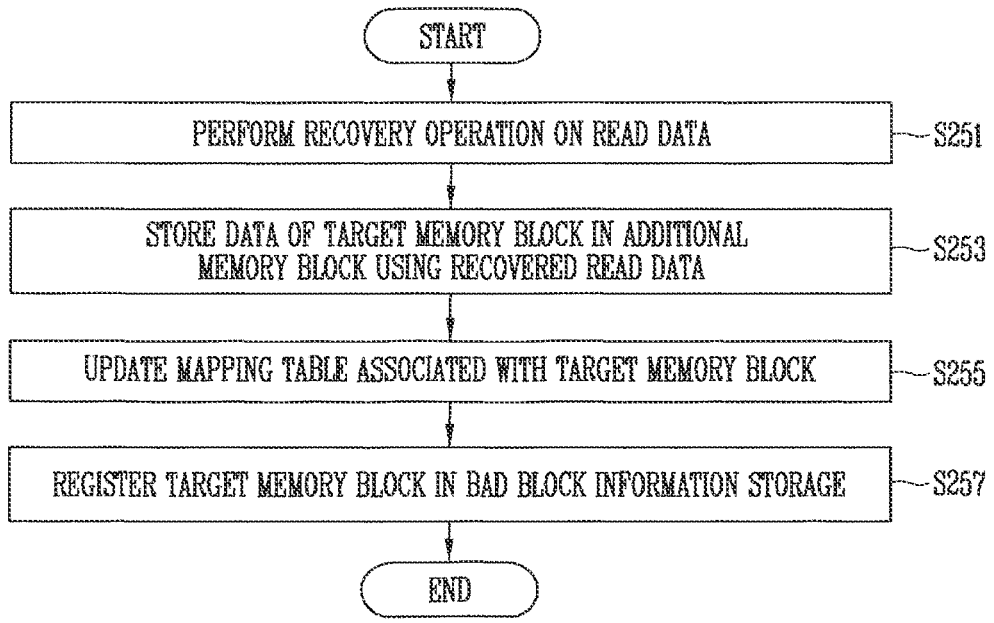
FIG. 18 is a flowchart illustrating an example of step S250 in FIG. 17.

FIG. 18 is a flowchart illustrating an example of step S250 in FIG. 17. Referring to FIG. 18, the step S250 of performing defect processing on the target memory block may include step S251, step S253, step S255 and step S257. The step S251 may include performing a recovery operation on the read data. The step S253 may include storing data of the target memory block in an additional memory block using the recovered read data. The step S255 may include updating a mapping table associated with the target memory block. The step S257 may include registering the target memory block in the bad block information storage 227 of FIG. 15.

At step S251, the data backup processor 225 performs a recovery operation on the read data in response to the received second detection data DET2. At step S251, an operation substantially identical to the data recovery operation performed at step S270 of FIG. 17 may be performed.

In order to perform defect processing on the target memory block, data stored in the target memory block is stored in the additional memory block at step S253. In detail, the data backup processor 225 may generate a backup control signal BUCTR for backing up the data of the target memory block onto the additional memory block, and may transmit the backup control signal BUCTR to the command generator 230. The command generator 230 may generate a command for moving the data of the target memory block to the additional memory block in response to the backup control signal BUCTR.

At step S255, the mapping table associated with the target memory block is updated. When the data of the target memory block is stored in the additional memory block at step S253, at step S255, a physical address associated with the logical address of the corresponding data is updated from the block address of the target memory block to the block address of the additional memory block onto which the data is backed up.

At step S257, the target memory block is registered in the bad block information storage 227. Since the data of the target memory block is copied to the additional memory block and the physical address of the corresponding data is updated in the mapping table at steps S253 and S255, the target memory block may be processed to be no longer used by registering the target memory block as a bad block.

Figure 19:
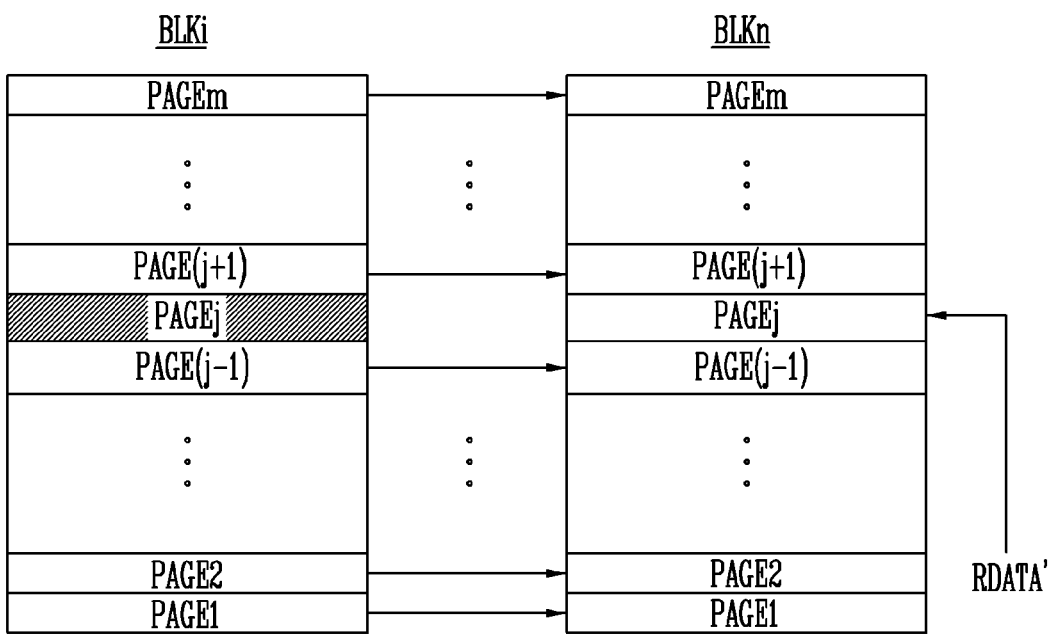
FIG. 19 is a diagram illustrating operations of steps S253 and S255 in FIG. 18.

FIG. 19 is a diagram illustrating operations of steps S253 and S255 in FIG. 18.

In FIG. 19, a target memory block BLKi and an additional memory block BLKn are illustrated. When an error correction failure occurs in two or more error correction units, that is, chunks, in data RDATA stored in a physical page PAGEj of the target memory block BLKi, data stored in the target memory block BLKi is equally stored in the additional memory block BLKn at step S253. The physical page PAGEj in which the read data RDATA having failed in error correction is stored is indicated by hatched lines. Among pieces of data stored in a plurality of physical pages PAGE1 to PAGEm of the target memory block BLKi, the data stored in the physical page PAGEj is data having failed in error correction, and thus read data RDATA, recovered at step S251, is stored in the additional memory block BLKn. When the data of the target memory block BLKi is stored in the additional memory block BLKn, the mapping table for the data is updated at step S255. In detail, the physical address of the corresponding data is changed from the address of the target memory block BLKi to the address of the additional memory block BLKn.

Figure 20:
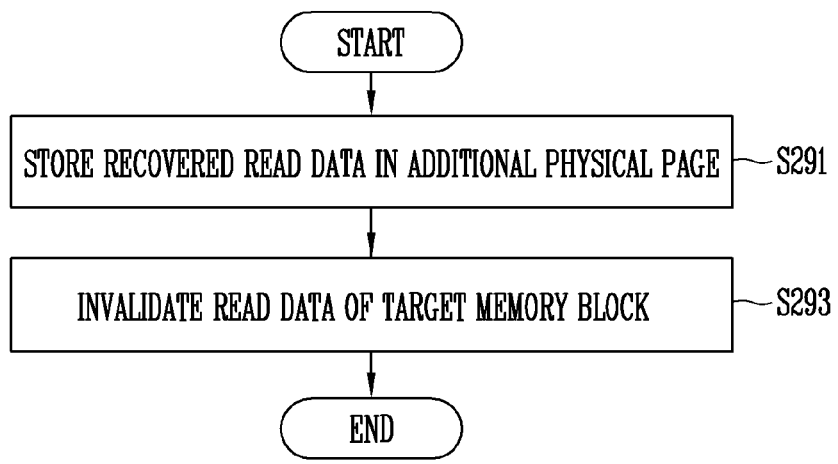
FIG. 20 is a flowchart illustrating an example of step S290 in FIG. 17.
Figure 21:
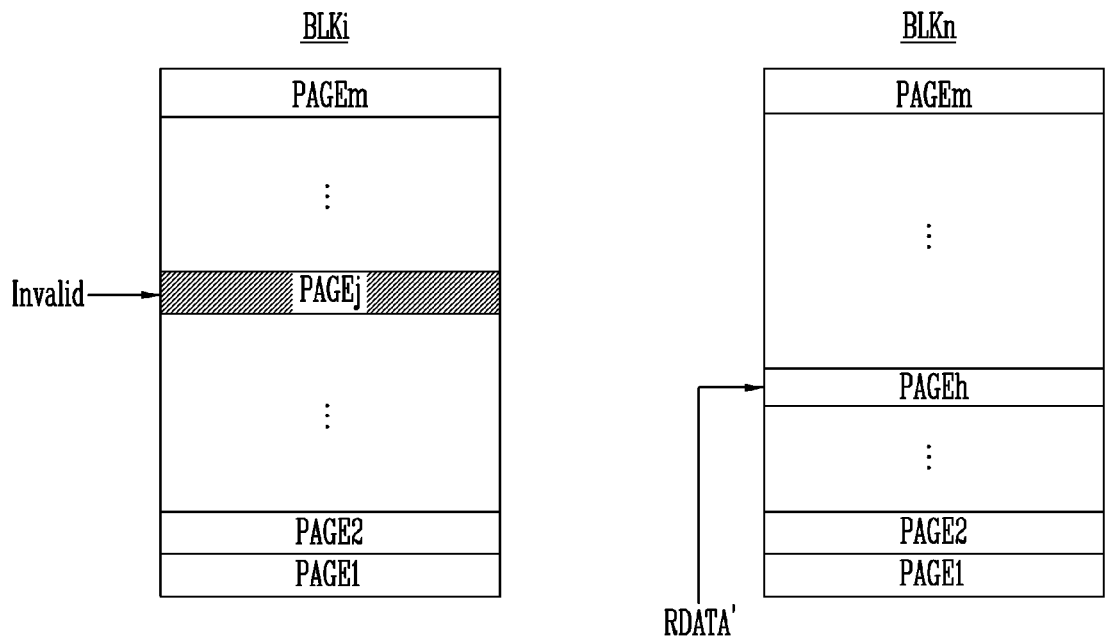
FIG. 21 is a diagram illustrating the read reclaim operation in FIG. 20.

FIG. 20 is a flowchart illustrating an example of step S290 in FIG. 17. FIG. 21 is a diagram illustrating the read reclaim operation in FIG. 20. The following description is made with reference to FIGS. 20 and 21 together.

Referring to FIG. 20, the step S290 of performing the read reclaim operation on read data RDATA includes step S291 and step S293. The step S291 may include storing recovered read data RDATA' in an additional physical page. The step S293 may include invalidating the read data of the target memory block.

At step S291, the recovered read data RDATA' is stored in a physical page PAGEh of the additional memory block BLKn. The read data RDATA' may be the data recovered at step S270 of FIG. 17. Although an embodiment in which the recovered read data RDATA' is stored in the additional memory block BLKn is illustrated in FIG. 21, the present disclosure is not limited thereto. For example, the recovered read data RDATA' may be stored in the target memory block BLKi. In this case, the recovered read data RDATA' may be stored in an additional idle physical page different from the physical page PAGEj.

Thereafter, at step S293, the read data of the target memory block BLKi is invalidated. That is, the data of the physical page PAGEj, in which the read data RDATA was stored, may be invalidated. At step S293, the mapping table associated with the corresponding data may be updated. That is, the physical address of the mapping table associated with the read data RDATA may be changed from an address indicating the physical page PAGEj to an address indicating the physical page PAGEh in which the recovered read data RDATA' is stored.

The read reclaim operation at step S290 illustrated in FIGS. 20 and 21 may be performed on a page basis. However, the present disclosure is not limited thereto. The read reclaim operation at step S290 may be performed on a block basis, as will be described later with reference to FIG. 22.

Figure 22:
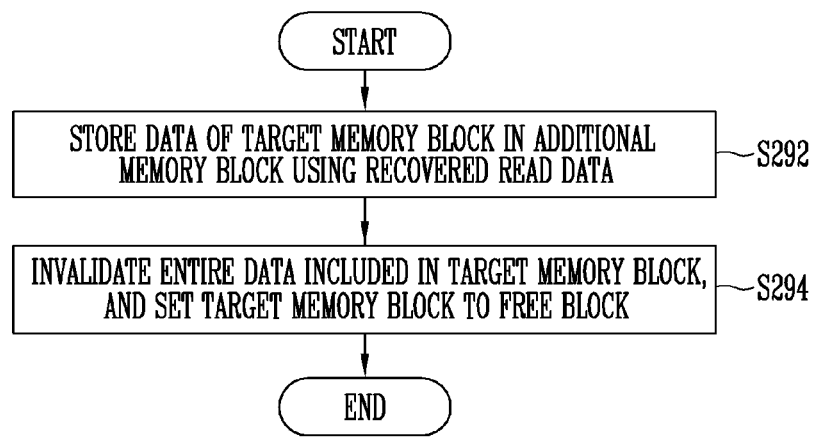
FIG. 22 is a flowchart illustrating an example of step S290 in FIG. 17.

FIG. 22 is a flowchart illustrating an example of step S290 in FIG. 17. Referring to FIG. 22, the step S290 of performing the read reclaim operation may include step S292 and step S294. The step S292 may include storing the data of the target memory block in an additional memory block using recovered read data. The step S294 may include invalidating the entire data included in the target memory block and setting the target memory block to a free block.

The operation at step S292 may be performed in substantially the same manner as that illustrated in FIG. 19. That is, data stored in the target memory block BLKi may be equally stored in the additional memory block BLKn, but, instead of the read data RDATA having failed in error correction, the recovered read data RDATA' may be may be stored in the additional memory block BLKn.

At step S294, the entire data of the target memory block BLKi may be invalidated. Accordingly, the target memory block BLKi may be set to a free block. Thereafter, an erase operation may be performed on the target memory block so that the target memory block is used to store additional data.

Figure 23:
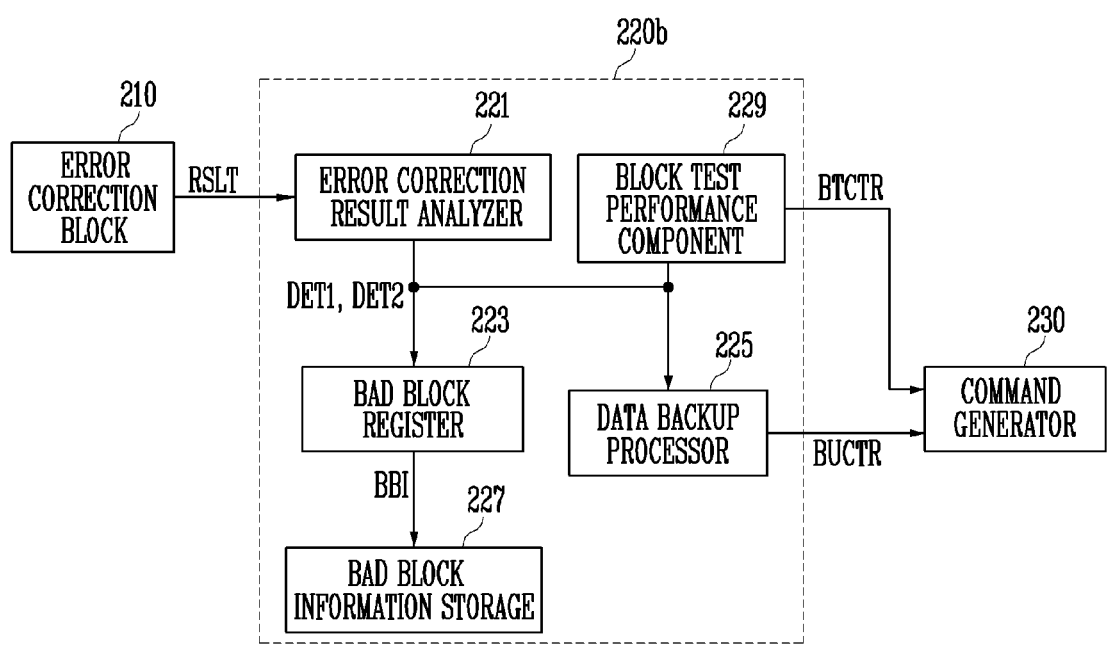
FIG. 23 is a block diagram illustrating a block manager in accordance with an embodiment of the present disclosure.

FIG. 23 is a block diagram illustrating a block manager 220b in accordance with an embodiment of the present disclosure. The block manager 220b of FIG. 23 is an example of the block manager 220 of FIG. 7.

Referring to FIG. 23, the block manager 220b may include an error correction result analyzer 221, a bad block register 223, a data backup processor 225, a bad block information storage 227, and a block test performance component (block test performance) 229. The block manager 220b of FIG. 23 has substantially the same configuration as the block manager 220a of FIG. 15, except that the block manager 220b further includes the block test performance 229. Accordingly, description of the error correction result analyzer 221, the bad block register 223, the data backup processor 225, and the bad block information storage 227 are omitted here.

When an error correction failure is detected in the error correction result data RSLT, the error correction result analyzer 221 transfers the result of detection to the bad block register 223, the data backup processor 225, and block test performance 229. In detail, when an error correction operation fails only in one of the plurality of chunks, the error correction result analyzer 221 transmits first detection data DET1 to the bad block register 223, the data backup processor 225, and the block test performance 229. In contrast, when an error correction operation fails in two or more of the plurality of chunks, the error correction result analyzer 221 transmits second detection data DET2 to the bad block register 223 and the data backup processor 225.

The bad block register 223 performs defect processing on the memory block in which the read data RDATA was stored in response to the second detection data DET2. The data backup processor 225 may generate a backup control signal BUCTR for data backup processing related to the read data RDATA, and may transfer the backup control signal BUCTR to the command generator 230.

The block test performance 229 may generate a block test control signal BTCTR for performing a block test operation on a target memory block in which the read data RDATA is stored in response to the first detection data DET1. Further, the block test performance 229 may transfer the block test control signal BTCTR to the command generator 230. The command generator 230 may generate a command for performing the block test operation on the target memory block in response to the block test control signal BTCTR. The block test operation performed on the target memory block will be described in detail later with reference to FIG. 25.

Figure 24:
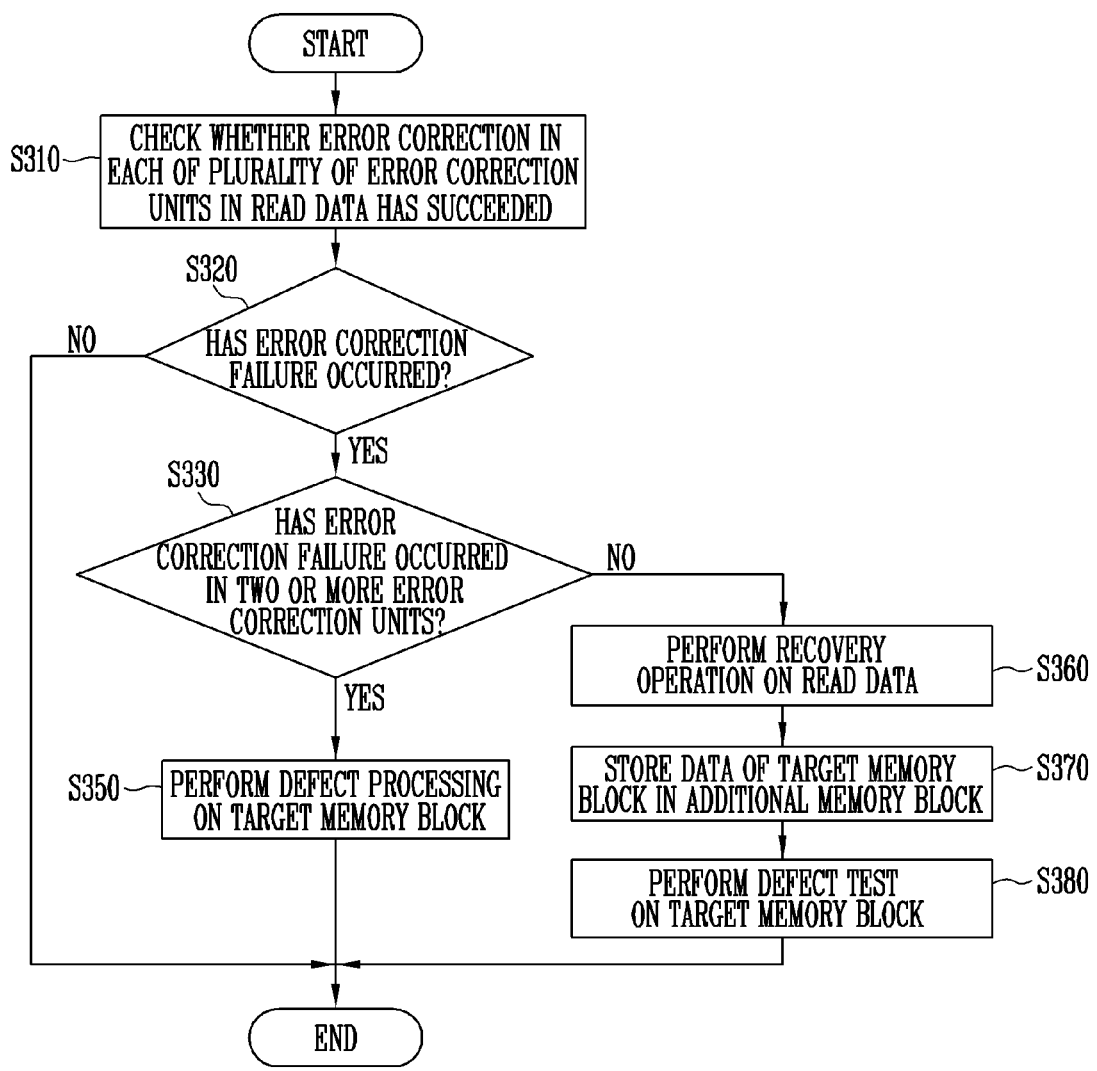
FIG. 24 is a flowchart illustrating an example of step S160 in FIG. 16.

FIG. 24 is a flowchart illustrating an example of step S160 in FIG. 16.

Referring to FIG. 24, the step S160 of performing defect processing on the target memory block based on the result of the error correction operation includes step S310, step S320, step S330, step S350 and step S360 to step S380. The step S310 may include checking whether error correction in each of a plurality of error correction units in the read data RDATA has succeeded. The step S320 may include determining whether an error correction failure has occurred. The step S330 may include determining whether an error correction failure has occurred in two or more error correction units. When it is determined that the error correction failure has occurred in two or more error correction units (S330, YES), the step S350 may include performing defect processing on the target memory block. Steps S310, S320, S330, and S350 of FIG. 24 may be configured in substantially the same manner as steps S210, S220, S230, and S250 of FIG. 17. Therefore, description of such steps is omitted here.

In contrast, when it is determined that the error correction failure has not occurred in two or more error correction units (S330, NO), step S360 to step S380 may be performed. The step S360 may include performing a recovery operation on the read data. The step S370 may include storing data of the target memory block in an additional memory block. The step S380 may include performing a defect test on the target memory block. Step S360 of FIG. 24 may be performed in substantially the same manner as step S270 of FIG. 17. Therefore, description of step S360 is omitted here.

At step S370, the data of the target memory block may be stored in an additional memory block. The reason for this is to perform a defect test on the target memory block at step S380. At step S370, as described above with reference to FIG. 19, the data of the target memory block BLKi may be stored in an additional memory block BLKn.

Thereafter, the defect test is performed on the target memory block at step S380. A detailed configuration of step S380 will be described later with reference to FIG. 25.

Referring to the embodiment illustrated in FIG. 24, when the error correction failure has occurred in two or more of a plurality of error correction units included in the read data RDATA of a physical page PAGEj, defect processing is immediately performed on the target memory block at step S350. However, when the error correction failure has occurred only in one of the plurality of error correction units, a defect test is performed on the target memory block BLKi at step S380 without defect processing being immediately performed on the target memory block BLKi, and then whether to perform defect processing on the target memory block BLKi is determined. Accordingly, in accordance with an embodiment of the present disclosure, the corresponding memory block is processed as a bad block only when there is a strong possibility that, when an error correction failure occurs, the cause of the failure is actually due to a physical defect in the memory block, thus enabling the memory blocks in the memory cell array 110 to be more efficiently used.

Figure 25:
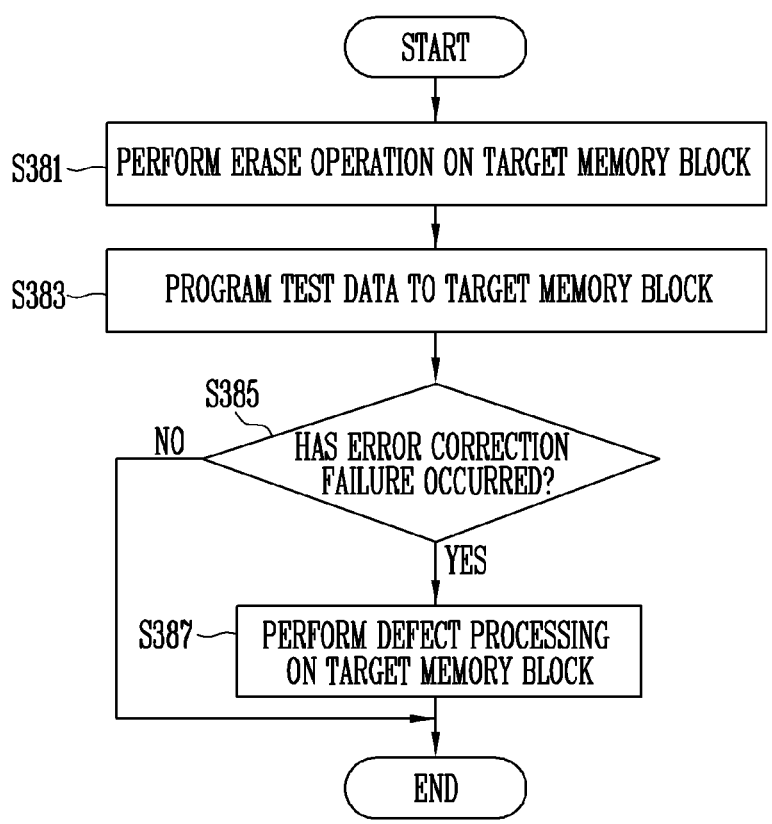
FIG. 25 is a flowchart illustrating an example of step S380 in FIG. 24.

FIG. 25 is a flowchart illustrating an example of step S380 in FIG. 24.

Referring to FIG. 25, the step S380 of performing the defect test on the target memory block includes step S381, step S383, step S385 and step S387. The step S381 may include performing an erase operation on the target memory block. The step S383 may include programming test data to the target memory block. The step S385 may include determining whether an error correction failure has occurred in the programmed test data. The step S387 may include performing defect processing on the target memory block when the error correction failure has occurred in the programmed test data (S385, YES).

Since the data of the target memory block is stored in the additional memory block at step S370, the target memory block may be erased for a test operation at step S381. Thereafter, the test data is programmed to the target memory block at step S383. The test data may be dummy data or may be arbitrary data required to test whether the target memory block BLKi is defective.

Thereafter, at step S385, whether an error correction failure has occurred is determined. At step S385, an error correction operation may be performed by reading the programmed test data.

When an error correction failure has not occurred, it may be determined that a physical defect is not present in the target memory block. Therefore, the defect test step S380 performed on the target memory block is terminated.

When the error correction failure has occurred, it may be determined that a physical defect is present in the target memory block because an error correction failure has repeatedly occurred in the target memory block. Therefore, defect processing is performed on the target memory block at step S387. Step S387 may be performed in substantially the same manner as step S350 of FIG. 24.

Figure 26:
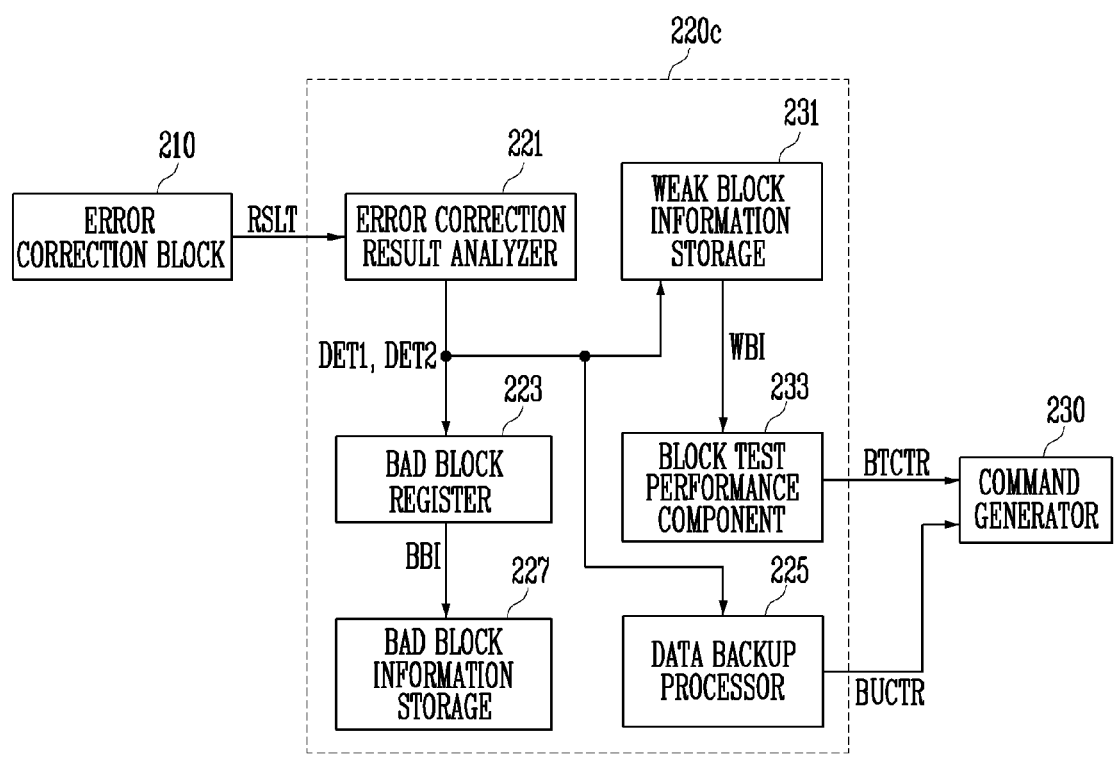
FIG. 26 is a block diagram illustrating a block manager in accordance with an embodiment of the present disclosure.

FIG. 26 is a block diagram illustrating a block manager 220c in accordance with an embodiment of the present disclosure. The block manager 220c of FIG. 26 is an example of the block manager 220 of FIG. 7.

Referring to FIG. 26, the block manager 220c may include an error correction result analyzer 221, a bad block register 223, a data backup processor 225, a bad block information storage 227, a weak block information storage 231, and a block test performance component (block test performance) 233. The block manager 220c of FIG. 26 has substantially the same configuration as the block manager 220a of FIG. 15, except that the block manager 220c further includes the weak block information storage 231 and the block test performance 233. Accordingly, description of the error correction result analyzer 221, the bad block register 223, the data backup processor 225, and the bad block information storage 227 are omitted here.

When an error correction failure is detected in error correction result data RSLT, the error correction result analyzer 221 transfers the result of detection to the bad block register 223, the data backup processor 225, and the weak block information storage 231. In detail, when an error correction operation has failed only in one of a plurality of chunks, the error correction result analyzer 221 transmits first detection data DET1 to the weak block information storage 231. The weak block information storage 231 determines the corresponding memory block to be a weak block based on the received first detection data DET1, and stores information about the determined weak block. The weak block information storage 231 may store information about a plurality of weak blocks. The weak block information storage 231 may transfer weak block information WBI to the block test performance 233 at a specific time. For example, the weak block information storage 231 may transfer the weak block information WBI to the block test performance 233 at a time at which an operation request is not transmitted from the host 300 to the controller 200 and the memory system 1000 is in an idle state, or at a time at which the semiconductor memory device 100 is in an idle state. In this case, the block test performance 233 may perform the block test operation on the weak blocks based on the weak block information WBI during an idle time.

When the error correction operation has failed in two or more of the plurality of chunks, second detection data DET2 is transmitted to the bad block register 223 and the data backup processor 225.

The bad block register 223 performs defect processing on a memory block in which the read data RDATA was stored in response to the second detection data DET2. The data backup processor 225 may generate a backup control signal BUCTR for data backup processing related to the read data RDATA, and may transfer the backup control signal BUCTR to the command generator 230.

The block test performance 233 may generate a block test control signal BTCTR for performing a block test operation on a weak block in response to the weak block information WBI provided from the weak block information storage 231. Further, the block test performance 233 may transfer the block test control signal BTCTR to the command generator 230. The command generator 230 may generate a command for performing the block test operation on the weak block in response to the block test control signal BTCTR. The block test operation performed on the weak block will be described later with reference to FIG. 28.

Figure 27:
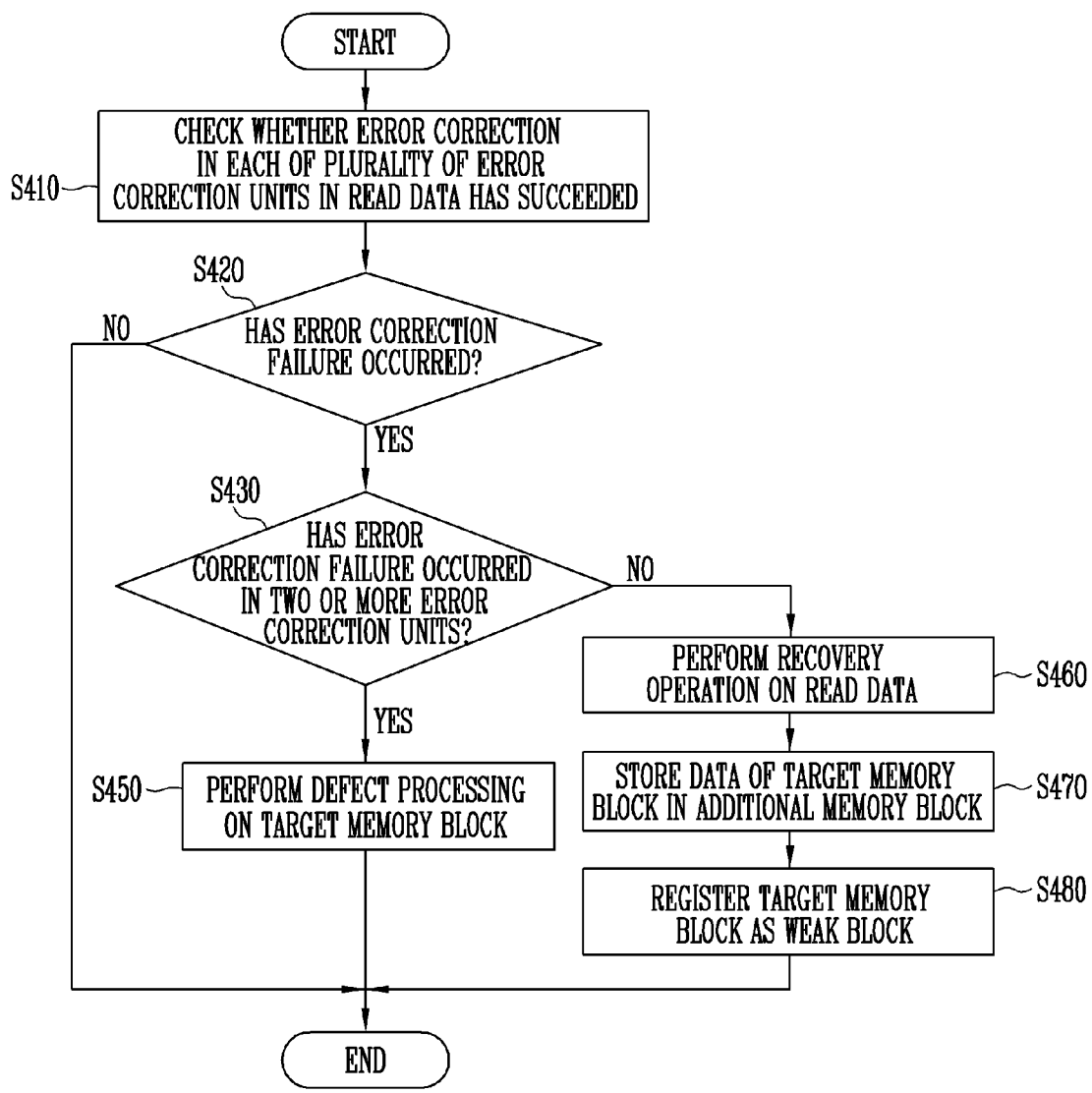
FIG. 27 is a flowchart illustrating an example of step S160 in FIG. 16.

FIG. 27 is a flowchart illustrating an example of step S160 in FIG. 16.

Referring to FIG. 27, the step S160 of performing defect processing on the target memory block based on the result of the error correction operation includes step S410, step S420, step S430, step S450, step S460, step S470 and step S480. The step S410 may include checking whether error correction in each of a plurality of error correction units in the read data RDATA has succeeded. The step S420 may include determining whether an error correction failure has occurred. The step S430 may include determining whether an error correction failure has occurred in two or more error correction units. When it is determined that the error correction failure has occurred in two or more error correction units (S430, YES), the step S450 may include performing defect processing on the target memory block. Steps S410, S420, S430, and S450 of FIG. 27 may be configured in substantially the same manner as steps S310, S320, S330, and S350 of FIG. 24. Therefore, description of these steps is omitted here.

In contrast, when the error correction failure has not occurred in two or more error correction units (S430, NO), the step S460 to the step S480 may be performed. The step S460 may include performing a recovery operation on the read data. The step S470 may include storing data of the target memory block in an additional memory block. The step S480 may include registering the target memory block as a weak block. Steps S460 and S470 of FIG. 27 may be configured in substantially the same manner as steps S360 and S370 of FIG. 24. Therefore, description of steps S460 and S470 are omitted here.

At step S480, the target memory block is registered as a weak block. The reason for this is to test registered weak blocks in a batch manner during the idle time of a memory system 1000 or a semiconductor memory device 100. Therefore, at step S480, a target memory block in which an error correction failure has occurred in one error correction unit may be determined to be a weak block, and then the weak block may be registered in the weak block information storage 231. Unlike the embodiment illustrated in FIG. 24, a defect test is not immediately performed on the target memory block in the embodiment of FIG. 27. As described above, the block test operation may be performed on weak blocks at a time at which an operation request is not transmitted from the host 300 to the controller 200 and then the semiconductor memory device 100 is in an idle state. The defect test operation performed on weak blocks will be described later with reference to FIG. 28.

Referring to the embodiment illustrated in FIG. 27, when the error correction failure has occurred in two or more of a plurality of error correction units included in the read data RDATA of a physical page PAGEj, defect processing is immediately performed on the target memory block at step S450. However, when the error correction failure has occurred only in one of the plurality of error correction units, the target memory block BLKi is registered as a weak block suspected to have a defect at step S480 without defect processing being immediately performed on the target memory block BLKi, so that a defect test operation may be subsequently performed. Accordingly, in accordance with an embodiment of the present disclosure, the corresponding memory block is processed as a bad block only when there is a strong possibility that, when an error correction failure occurs, the cause of the failure is actually due to a physical defect in the memory block, thus enabling the memory blocks in the memory cell array 110 to be more efficiently used.

Figure 28:
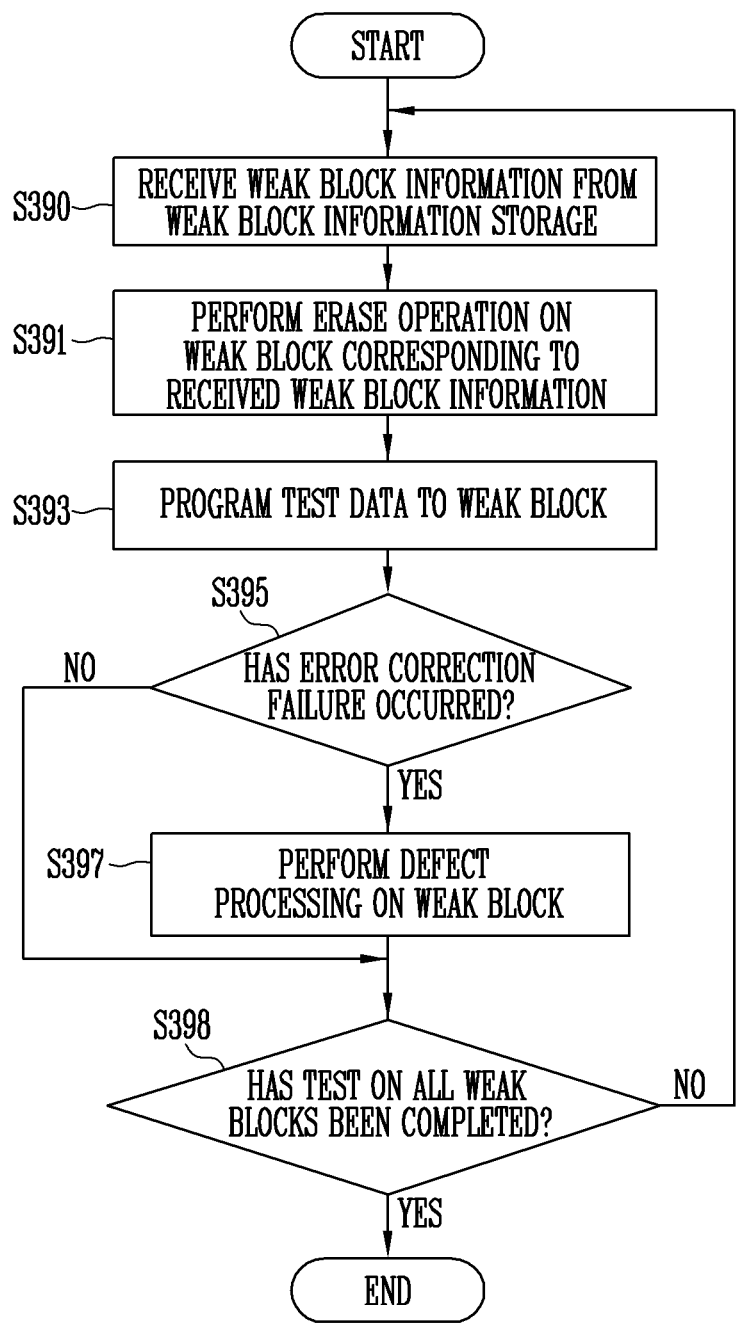
FIG. 28 is a flowchart illustrating an operation of a block test performance in FIG. 26.

FIG. 28 is a flowchart illustrating an operation of the block test performance 233 in FIG. 26.

Referring to FIG. 28, the operation of performing the defect test operation on weak blocks during the idle time of the memory system 1000 includes step S390, step S391, step S393, step S395, step S397 and step S398. The step S390 may include receiving weak block information WBI from the weak block information storage 231. The step S391 may include performing an erase operation on a weak block corresponding to the received weak block information. The step S393 may include programming test data to the weak block. The step S395 may include determining whether an error correction failure has occurred in the programmed test data. When an error correction failure has occurred in the programmed test data (S395, YES), the step S397 and the step S398 may be performed. The step S398 may include performing defect processing on the corresponding weak block. The step S398 may include determining whether the test operation on all weak blocks has been completed.

Since the data of each weak block is already stored in the additional memory block at step S370, the weak block may be erased for the test operation at step S391. Thereafter, the test data is programmed to the weak block at step S393.

Thereafter, at step S395, whether an error correction failure has occurred is determined. At step S395, an error correction operation may be performed by reading the programmed test data.

When an error correction failure has not occurred, it may be determined that a physical defect is not present in the weak block. Therefore, the defect test step performed on the corresponding weak block is terminated, and whether there is another weak block that is a test target is determined at step S398.

When the error correction failure has occurred, it may be determined that a physical defect is present in the weak block because the error correction failure has repeatedly occurred in the corresponding weak block. Therefore, defect processing is performed on the corresponding weak block at step S397. Step S397 may be performed in substantially the same manner as step S450 of FIG. 27.

When it is determined at step S398 that the test operation has been completed on all weak blocks, the process is terminated. In contrast, when it is determined that there is an additional weak block on which the test operation is to be performed (S398, NO), the process proceeds to step S390 of receiving weak block information WBI about the additional weak block. Thereafter, steps S391 to S398 may be repeatedly performed.

In accordance with the embodiments illustrated in FIGS. 26 to 28, when an error correction failure has occurred only in one error correction unit during the read operation, the corresponding memory block may be registered as a weak block. Thereafter, during the idle time of the memory system 1000, the test operation may be performed on the registered weak blocks in a batch manner.

Figure 29:
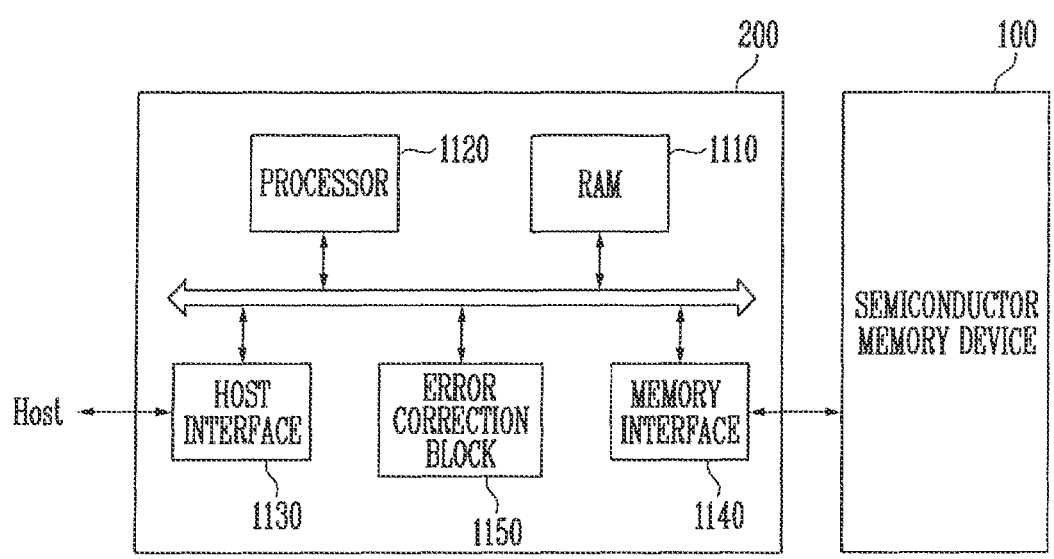
FIG. 29 is a block diagram illustrating a memory system including a semiconductor memory device and a controller.

FIG. 29 is a block diagram illustrating a memory system 1000 including a semiconductor memory device 100 and a controller 200.

Referring to FIG. 29, the memory system 1000 includes the semiconductor memory device 100 and the controller 200.

The semiconductor memory device 100 may have the same configuration and operation as the semiconductor memory device described with reference to FIG. 2. The controller 200 may have the same configuration and operation as the controller 200 described above with reference to FIGS. 1 and 7. Accordingly, description of such configuration and operation is omitted here.

The controller 200 is coupled to a host and the semiconductor memory device 100. The controller 200 may access the semiconductor memory device 100 in response to a request from the host. For example, the controller 200 may control read, write, erase, and background operations of the semiconductor memory device 100. The controller 200 may provide an interface between the semiconductor memory device 100 and the host. The controller 200 may run firmware for controlling the semiconductor memory device 100.

The controller 200 includes a random access memory (RAM) 1110, a processor 1120, a host interface 1130, a memory interface 1140, and an error correction block 1150. The RAM 1110 may be used as at least one of a working memory for the processor 1120, a cache memory between the semiconductor memory device 100 and the host, and a buffer memory between the semiconductor memory device 100 and the host. The RAM 1110 may function as the buffer memory 240 of FIG. 7. The processor 1120 controls the overall operation of the controller 200. The processor 1120 may perform the functions of the block manager 220 and the command generator 230 of FIG. 7 by running the firmware.

The host interface 1130 includes a protocol for performing data exchange between the host and the controller 200. In an embodiment, the controller 200 may communicate with the host through at least one of various interface protocols such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1140 interfaces with the semiconductor memory device 100. For example, the memory interface may include a NAND interface or NOR interface.

The error correction block 1150 may detect and correct an error in data received from the semiconductor memory device 100 using an error correction code (ECC). The error correction block 1150 of FIG. 29 may be a component substantially identical to the error correction block 210 of FIG. 7.

The controller 200 and the semiconductor memory device 100 may be integrated into a single semiconductor device. In an embodiment, the controller 200 and the semiconductor memory device 100 may be integrated into a single semiconductor device to form a memory card, such as a personal computer memory card international association (PCM-CIA), a compact flash card (CF), a smart media card (e.g., SM or SMC), a memory stick, a multimedia card (e.g., MMC, RS-MMC, or MMCmicro), a SD card (e.g., SD, miniSD, microSD, or SDHC), or a universal flash storage (UFS).

In another embodiment, the controller 200 and the semiconductor memory device 100 may be integrated into a single semiconductor device to form a solid state drive (SSD). The SSD includes a storage device configured to store data in a semiconductor memory. When the memory system 1000 is used as the SSD, an operation speed of the host coupled to the memory system 1000 may be phenomenally improved.

In an embodiment, the memory system 1000 may be provided as one of various elements of an electronic device such as a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or one of various elements for forming a computing system.

In an embodiment, the semiconductor memory device 100 or the memory system 1000 may be embedded in various types of packages. For example, the semiconductor memory device 100 or the memory system 1000 may be packaged as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-Level Processed Stack Package (WSP).

Figure 30:
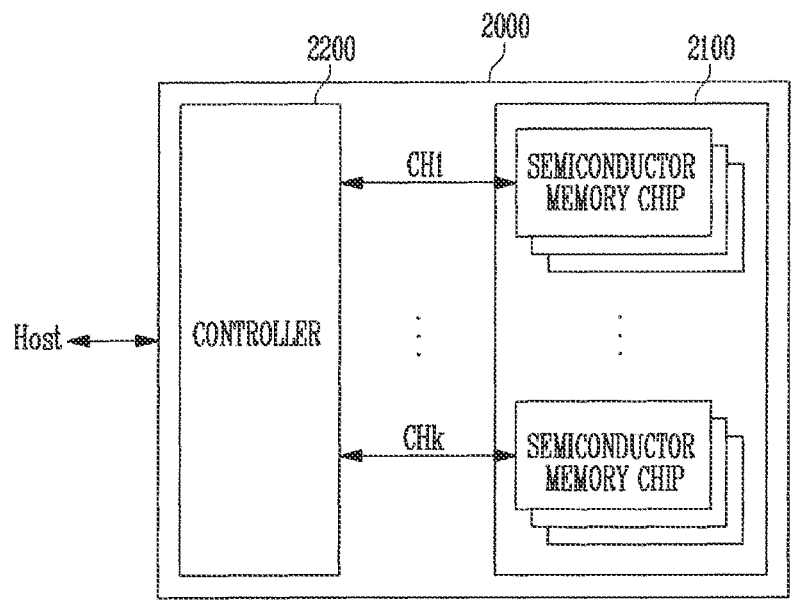
FIG. 30 is a block diagram illustrating an application example of the memory system in FIG. 29.

FIG. 30 is a block diagram illustrating an application example 2000 of the memory system 1000 of FIG. 29.

Referring to FIG. 30, the memory system 2000 includes a semiconductor memory device 2100 and a controller 2200. The semiconductor memory device 2100 includes a plurality of semiconductor memory chips. The semiconductor memory chips are divided into a plurality of groups.

In FIG. 30, it is illustrated that each of the plurality of groups communicates with the controller 2200 through a respective one of first to k-th channels CH1 to CHk. Each semiconductor memory chip may have the same configuration and operation as the semiconductor memory device 100, described above with reference to FIG. 2.

Each group communicates with the controller 2200 through one common channel. The controller 2200 has the same configuration as the controller 200, described above with reference to FIG. 29, and is configured to control the plurality of memory chips of the semiconductor memory device 2100 through the plurality of channels CH1 to CHk.

In FIG. 30, a description has been made such that a plurality of semiconductor memory chips are coupled to a single channel. However, it will be understood that the memory system 2000 may be modified such that a single semiconductor memory chip is coupled to a single channel.

Figure 31:
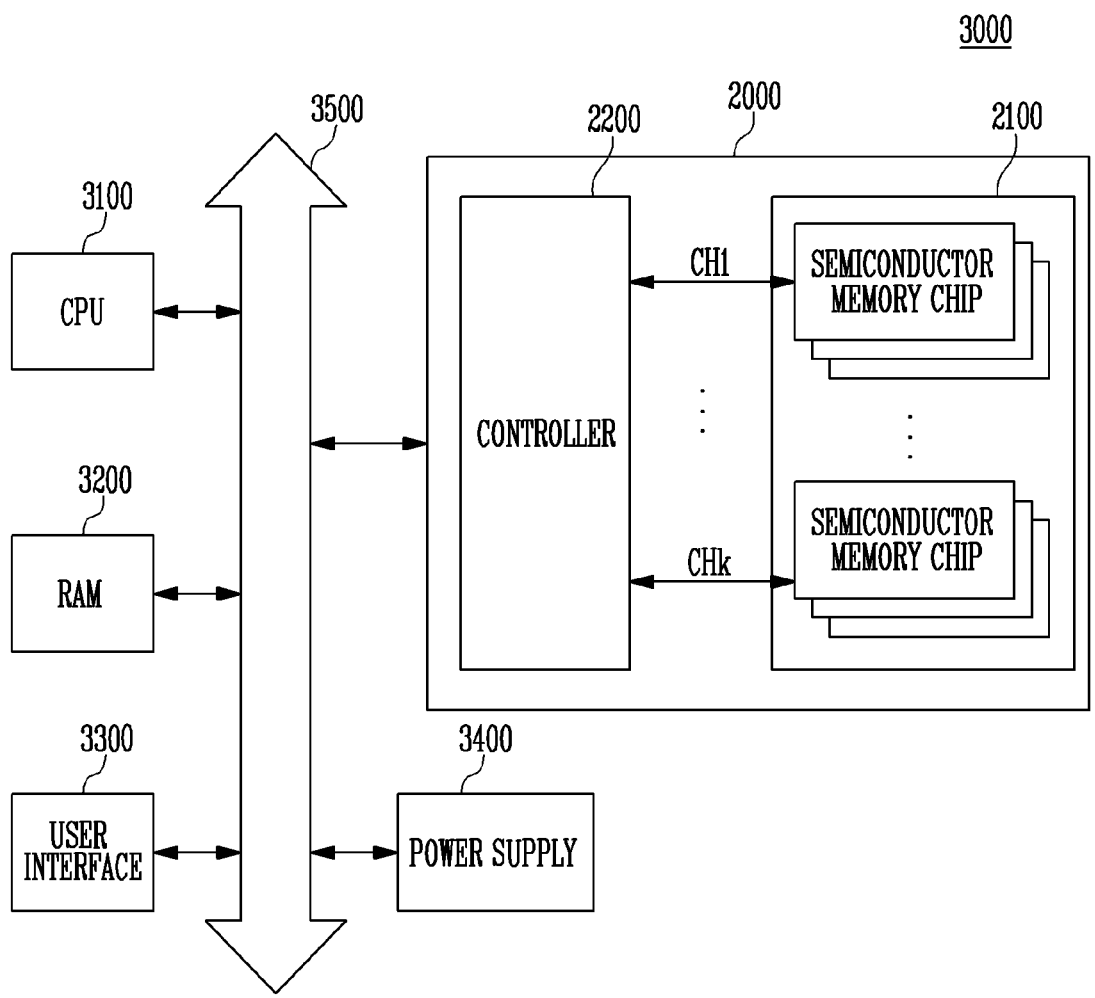
FIG. 31 is a block diagram illustrating a computing system including the memory system described with reference to FIG. 30.

FIG. 31 is a block diagram illustrating a computing system 3000 including the memory system 2000 described with reference to FIG. 30.

Referring to FIG. 31, the computing system 3000 includes a central processing unit (CPU) 3100, a random access memory (RAM) 3200, a user interface 3300, a power supply 3400, a system bus 3500, and the memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 31, a semiconductor memory device 2100 is illustrated as being coupled to the system bus 3500 through the controller 2200. However, the semiconductor memory device 2100 may be directly coupled to the system bus 3500. Here, the function of the controller 2200 may be performed by the CPU 3100 and the RAM 3200.

In FIG. 31, the memory system 2000 described with reference to FIG. 30 is illustrated as being provided. However, the memory system 2000 may be replaced with the memory system 1000 described with reference to FIG. 29. In an embodiment, the computing system 3000 may include both the memory systems 1000 and 2000 described with reference to FIGS. 29 and 30.

In accordance with an embodiment of the present disclosure, a controller, which can efficiently use memory blocks of a semiconductor memory device, is provided.

In accordance with an embodiment of the present disclosure, a method of operating a controller, which can efficiently use memory blocks of a semiconductor memory device, is provided.

While various embodiments of the present disclosure have been illustrated and described, those skilled in the art will appreciate in light of the present disclosure that various modifications, additions and substitutions are possible. Therefore, the scope of the present invention is not limited to the disclosed embodiments. Rather, the present invention is defined by the appended claims and equivalents thereof.

What is claimed is:

1. A controller for controlling an operation of a semiconductor memory device having a plurality of memory blocks, the controller comprising:
an error correction block configured to perform an error correction operation on read data received from the semiconductor memory device, the read data being stored in a target memory block among the plurality of memory blocks; and
a block manager configured to analyze a result of the error correction operation and selectively perform defect processing on the target memory block in which the read data is stored, based on a number of error correction units in which an error correction failure has occurred, among a plurality of error correction units included in the read data,
wherein the block manager performs the defect processing on the target memory block when the error correction failure has occurred in two or more error correction units among the plurality of error correction units,
wherein the block manager does not perform the defect processing on the target memory block when the error correction failure has occurred in one error correction unit among the plurality of error correction units,
wherein the defect processing on the target memory block comprises registering the target memory block as a bad block,
wherein the block manager is configured to perform a recovery operation on the read data and perform a read reclaim operation using the read data when the error correction failure has occurred in one of the plurality of error correction units.

2. The controller according to claim 1, wherein the block manager comprises:
an error correction result analyzer configured to analyze the result of the error correction operation and generate first detection data indicating that the error correction failure has occurred in one error correction unit or second detection data indicating that the error correction failure has occurred in two or more error correction units;
a data backup processor configured to generate a backup control signal for data backup processing related to the read data in response to any one of the first detection data and the second detection data;
a bad block register configured to generate bad block information about the target memory block in response to the second detection data; and
a bad block information storage configured to store the bad block information.

3. The controller according to claim 2, further comprising:
a command generator configured to generate a command for controlling an operation of the semiconductor memory device,
wherein the command generator generates a command for a data backup operation related to the read data in response to the backup control signal.

4. The controller according to claim 3, wherein the block manager further comprises:
a block test performance component configured to generate a block test control signal for a block test operation on the target memory block in response to the first detection data.

5. The controller according to claim 4, wherein the command generator generates a command for testing the target memory block in response to the block test control signal.

6. The controller according to claim 5, further comprising:
a buffer memory configured to store the read data.

7. The controller according to claim 3, wherein the block manager further comprises:
a weak block information storage configured to register the target memory block as a weak block in response to the first detection data; and
a block test performance component configured to generate a block test control signal for performing a test operation on the weak block based on weak block information provided from the weak block information storage.

8. The controller according to claim 7, wherein the weak block information storage transfers the weak block information to the block test performance component during idle time of the semiconductor memory device.

9. A method of operating a controller for controlling a semiconductor memory device, the method comprising:
receiving read data from the semiconductor memory device;
performing an error correction operation on the read data; and
analyzing a result of the error correction operation and selectively performing defect processing on a target memory block in which the read data is stored, based on a number of error correction units in which an error correction failure has occurred, among a plurality of error correction units included in the read data,
wherein analyzing the result of the error correction operation and selectively performing the defect processing on the target memory block comprises:
determining whether error correction in each of the plurality of error correction units included in the read data has succeeded; and
when it is determined that the error correction failure has occurred, determining whether the error correction failure has occurred in at least two error correction units among the plurality of error correction units, or the error correction failure has occurred in one error correction unit among the plurality of error correction units,
wherein the defect processing on the target memory block comprises registering the target memory block as a bad block, and
wherein analyzing the result of the error correction operation and selectively performing the defect processing on the target memory block further comprises:
performing the defect processing on the target memory block when it is determined that the error correction failure has occurred in two or more error correction units.

10. The method according to claim 9, wherein selectively performing defect processing on the target memory block comprises:
performing a recovery operation on the read data;
storing data of the target memory block in an additional memory block using the recovered read data;
updating a mapping table associated with the target memory block; and
registering the target memory block in a bad block information storage.

11. The method according to claim 9, further comprising, when the error correction failure has occurred in one error correction unit:
performing a recovery operation on the read data; and
performing a read reclaim operation on the read data.

12. The method according to claim 9, further comprising, when the error correction failure has occurred in one error correction unit:
performing a recovery operation on the read data;
storing data of the target memory block in an additional memory block; and
performing a defect test on the target memory block.

13. The method according to claim 12, wherein performing the defect test on the target memory block comprises:
performing an erase operation on the target memory block;
programming test data to the target memory block; and
reading the programmed data, and then determining whether an error correction failure has occurred in the programmed data.

14. The method according to claim 13, further comprising:
when the programmed data is read and the error correction failure has occurred in the programmed data, performing defect processing on the target memory block.

15. The method according to claim 9, further comprising, when the error correction failure has occurred in one error correction unit:
performing a recovery operation on the read data;
storing data of the target memory block in an additional memory block; and
registering the target memory block as a weak block.

* * * * *